United States Patent
Ito et al.

(10) Patent No.: US 7,397,178 B2
(45) Date of Patent: Jul. 8, 2008

(54) LUMINESCENCE CELL, LUMINESCENCE DEVICE WITH LUMINESCENCE CELL, LUMINESCENCE UNIT, LUMINESCENCE DEVICE WITH LUMINESCENCE UNIT, FRAME FOR LUMINESCENCE DEVICE, AND METHOD FOR MANUFACTURING LUMINESCENCE CELL

(75) Inventors: Hironori Ito, Kariya (JP); Yoshifumi Kato, Kariya (JP); Tetsuya Utsumi, Kariya (JP); Norihito Takeuchi, Kariya (JP)

(73) Assignee: Kabushiki Kaisha Toyota Jidoshokki, Kariya-shi (JP)

( * ) Notice: Subject to any disclaimer, the term of this patent is extended or adjusted under 35 U.S.C. 154(b) by 517 days.

(21) Appl. No.: 10/996,838

(22) Filed: Nov. 24, 2004

(65) Prior Publication Data
US 2005/0140286 A1 Jun. 30, 2005

(30) Foreign Application Priority Data
Nov. 25, 2003 (JP) ............................. 2003-393202

(51) Int. Cl.
*H01L 51/00* (2006.01)
(52) U.S. Cl. ....................................... 313/504; 313/506
(58) Field of Classification Search ................. 313/504, 313/506
See application file for complete search history.

(56) References Cited

U.S. PATENT DOCUMENTS 3,942,185 A * 3/1976 Lebailly ..................... 327/514
6,624,570 B1   9/2003 Nishio et al. ................. 313/506
6,693,296 B1 * 2/2004 Tyan ............................. 257/40
2006/0012289 A1 * 1/2006 Shiang ........................ 313/504

FOREIGN PATENT DOCUMENTS

| JP | 11-143398 | 5/1999 |
| JP | 2000-173771 | 6/2000 |
| JP | 2001-102171 | 4/2001 |
| JP | 2001-126871 | 5/2001 |

OTHER PUBLICATIONS

"Organic EL device and Industrialization forefront" edited by Seizou Miyata, NTS Inc., Nov. 30, 1998 (partial translation).

(Continued)

*Primary Examiner*—Karabi Guharay
(74) *Attorney, Agent, or Firm*—Morgan & Finnegan, LLP

(57) ABSTRACT

A luminescence cell having a novel structure includes a transparent conductor having a surface on which first and second regions are defined. A first electroluminescence element, including a first organic layer containing an organic luminescence material and a first electrode laminated on the first organic layer, is arranged on the first region. A second electroluminescence element, including a second organic layer containing an organic luminescence material and a second electrode laminated on the second organic layer, is arranged on the second region. The first electrode is physically separated from the second electrode. The first layer is physically separated from the second layer. The first and second organic layers emit light when current flows between the first and second electrodes. The light emitted from the organic layer passes through the transparent conductor and exits the luminescence cell.

42 Claims, 10 Drawing Sheets

OTHER PUBLICATIONS

"Control of Optical Field by Using a Photonic Crystal" by Kuon Inoue, received on Aug. 3, 2001, Surface Science, vol. 22, No. 11, pp. 702-709, 2001 (partial translation).

"Characterization of Photonic Crystal Organic Light Emitting Diode", 64th Japan Society of Applied Physics Academic Lecture Draft, p. 938, (31p-ZM-15) (partial translation).

"Fabrication and Optical Properties of Organic Semiconductor Photonic Crystals" 64th Japan Society of Applied Physics Academic Lecture Draft, p. 938 (31p-ZM-16) (partial translation).

* cited by examiner

LUMINESCENCE CELL, LUMINESCENCE DEVICE WITH LUMINESCENCE CELL, LUMINESCENCE UNIT, LUMINESCENCE DEVICE WITH LUMINESCENCE UNIT, FRAME FOR LUMINESCENCE DEVICE, AND METHOD FOR MANUFACTURING LUMINESCENCE CELL

CROSS-REFERENCE TO RELATED APPLICATIONS

This application is based upon and claims the benefit of priority from prior Japanese Patent Application No. 2003-393202, filed on Nov. 25, 2003, the entire contents of which are incorporated herein by reference.

BACKGROUND OF THE INVENTION

The present invention relates to an organic or inorganic electroluminescence (EL) cell. More particularly, the present invention relates to a luminescence cell, a luminescence device with the luminescence cell, a luminescence unit, a luminescence device with the luminescence unit, and a frame for the luminescence device, and a method for manufacturing the luminescence cell.

A lighting system or a display using an organic or inorganic EL device is conventionally known. However, enlargement of the EL device, particularly enlargement of the organic EL device is technically difficult. The main reason for this is because the materials of the EL device are vulnerable to the atmosphere. If oxygen and moisture in the atmosphere enter the EL device, a non-light emitting part (dark spot) is created or the properties are changed, and the EL device may not satisfy the properties as designed. Therefore, a large EL device is likely to breakdown. Further, since the yield in the manufacturing stage is not satisfactory, a large lighting system and display are difficult to form with the EL device.

A technique for aligning a plurality of small EL devices to form a large lighting system or a display has been proposed.

Japanese Laid-Open Patent Publication No. 11-143398 discloses a device in which a plurality of display lamps is integrated. In such a device, a plurality of organic electroluminescence devices each corresponding to a plurality of display lamps is divided and formed on one sheet of base material.

Japanese Laid-Open Patent Publication No. 2000-173771 discloses a line light source. The line light source includes a thin-film light emitting element including a light emitting region made by stacking a substrate, an anode, a thin-film layer and a cathode in order. A part where the anode and the cathode do not contact each other is formed by the thin-film layer. Thus, the line light source includes a plurality of light emitting regions divided in the longitudinal direction of the line light source.

Japanese Laid-Open Patent Publication No. 2001-102171 discloses a method for manufacturing an electroluminescence display unit. The method includes a step for laminating a plurality of small panels in which a circuit is formed on a respective pixel region and a large substrate, a step for forming the electroluminescence device on each pixel region, and a step for sealing all the electroluminescence devices.

Japanese Laid-Open Patent Publication No. 2001-126871 discloses an EL backlight device in which at least two EL sheets are joined together to be used as an area light source with a desired area. A marginal electrode is arranged at the edge of each EL sheet. The edge of one of the EL sheet overlaps one part of the edge of the other EL sheet at the joint of the EL sheets. The marginal electrode is not arranged at such overlapping part.

SUMMARY OF THE INVENTION

One aspect of the present invention is a luminescence cell including a conductor including one surface having a first region and a second region, a first layer laminated on the first region and containing a first luminescent material, a first electrode laminated on the first layer, the first region of the conductor, the first layer, and the first electrode forming a first electroluminescence element, a second layer laminated on the second region and containing a second luminescent material, and a second electrode laminated on the second layer, the second region of the conductor, the second layer and the second electrode forming a second electroluminescence element. The first layer and the second layer emit light rays when voltage is applied between the first electrode and the second electrode. The first electrode and the first layer are physically separated from the second electrode and the second layer, respectively.

Another aspect of the present invention is a luminescence unit including more than one of the above-described luminescence cell. The second electrode of each cell is electrically connected to the first electrode of at least one other cell. The first electroluminescence element and the second electroluminescence element of each cell are physically separated from the first electroluminescence element and the second electroluminescence element of another cell. The more than one luminescence cell includes a first end electrode disconnected from the second electrode of other cells and located at an electrical end and a second end electrode disconnected from the first electrode of other cells and located at an electrical end. The first and second layers emit light in each cell when voltage is applied between the first end electrode and the second end electrode.

A further aspect of the present invention is a luminescence device including more than one of the above-described luminescence cell electrically connected to each other. The first electroluminescence element and the second electroluminescence element of each luminescence cell is physically separated from the first electroluminescence element and the second electroluminescence element of another cell.

A further aspect of the present invention is a luminescence device including more than one of the above-described luminescence unit. The first electroluminescence element and the second electroluminescence element of each luminescence unit are physically separated from the first electroluminescence element and the second electroluminescence element of another luminescence unit. The more than one luminescence unit includes a first end electrode disconnected from the second electrode of other luminescence units and located at an electrical end, and a second end electrode disconnected from the first electrode of other luminescence units and located at an electrical end. The first and second layers emit light in each cell of each luminescence unit when voltage is applied between the first end electrode and the second end electrode.

A further aspect of the present invention is a method for manufacturing a luminescence cell including first and second layers that emit light when voltage is applied between a first electrode and a second electrode. The method includes providing a transparent substrate including a surface; forming a transparent conductor on the surface of the transparent substrate, the conductor including a surface contacting the surface of the transparent substrate and an opposite surface, the opposite surface having a first region and a second region; forming the first layer that contains a first luminescent material on the first region; forming the first electrode on the first layer; forming the second layer that contains a second luminescent material on the second region; forming the second electrode on the second layer; and forming a gap that separates the first layer and the first electrode respectively from the second layer and the second electrode by a predetermined distance.

A further aspect of the present invention is a method for manufacturing a luminescence cell including first and second layers that emit light when voltage is applied between a first electrode and a second electrode. The method includes providing a transparent substrate including a surface; forming a first electrode that is transparent on the surface of the transparent substrate; forming the first layer that contains a first luminescent material on the first electrode; forming the second electrode that is transparent on the surface of the transparent substrate; forming the second layer that contains a second luminescent material on the second electrode; forming a conductor on the first layer and the second layer to electrically connect the first layer and the second layer; and forming a gap that separates the first layer and the first electrode respectively from the second layer and the second electrode by a predetermined distance.

A further aspect of the present invention is a method for manufacturing a luminescence cell including first and second layers that emit light when voltage is applied between a first electrode and a second electrode. The method includes providing a substrate including a surface; forming a conductor on the surface of the substrate, the conductor including a surface contacting the surface of the substrate and an opposite surface, the opposite surface having a first region and a second region; forming the first layer that contains a first luminescent material on the first region; forming the first electrode that is transparent on the first layer; forming the second layer that contains a second luminescent material on the second region; forming the second electrode that is transparent on the second layer; and forming a gap that separates the first layer and the first electrode respectively from the second layer and the second electrode by a predetermined distance.

A further aspect of the present invention is a method for manufacturing a luminescence cell including first and second layers that emit light when voltage is applied between a first electrode and a second electrode. The method includes providing a substrate including a surface; forming the first electrode on the surface of the substrate; forming the first layer that contains a first luminescent material on the first electrode; forming the second electrode on the surface of the substrate; forming the second layer that contains a second luminescent material on the second electrode; forming a transparent conductor that electrically connects the first layer and the second layer on the first layer and the second layer; and forming a gap that separates the first layer and the first electrode respectively from the second layer and the second electrode by a predetermined distance.

A further aspect of the present invention is a method for manufacturing a luminescence cell including first and second layers that emit light when voltage is applied between a first electrode and a second electrode. The method includes providing a transparent substrate including a surface; forming a transparent conductor on the transparent substrate; forming an insulation wall on the conductor to partition the surface of the conductor into a first region and a second region; forming the first layer that contains a first luminescent material on the first region; forming the first electrode on the first layer; forming the second layer that contains a second luminescent material on the second region; and forming the second electrode on the second layer.

A further aspect of the present invention is a method for manufacturing a luminescence cell including first and second layers that emit light when voltage is applied between a first electrode and a second electrode. The method includes providing a transparent substrate including one surface; forming an insulation wall on the one surface of the transparent substrate to partition the one surface into a first region and a second region; forming the first electrode that is transparent on the first region; forming the first layer that contains a first luminescent material on the first electrode; forming the second electrode that is transparent on the second region; forming the second layer that contains a second luminescent material on the second electrode; and forming a conductor on the first layer and the second layer to electrically connect the first layer and the second layer.

A further aspect of the present invention is a method for manufacturing a luminescence cell including first and second layers that emit light when voltage is applied between a first electrode and a second electrode. The method includes providing a substrate including a surface; forming a conductor including a surface on the surface of the substrate; forming an insulation wall on the conductor to partition the surface of the conductor into a first region and a second region; forming the first layer that contains a first luminescent material on the first region of the conductor; forming the first electrode that is transparent on the first layer; forming the second layer that contains a second luminescent material on the second region of the conductor; and forming the second electrode that is transparent on the second layer.

A further aspect of the present invention is a method for manufacturing a luminescence cell including first and second layers that emit light when voltage is applied between a first electrode and a second electrode. The method includes providing a substrate including a surface; forming an insulation wall on the surface of the substrate to partition the one surface into a first region and a second region; forming the first electrode on the first region; forming the first layer that contains a first luminescent material on the first electrode; forming the second electrode on the second region; forming the second layer that contains a second luminescent material on the second electrode; and forming a transparent conductor on the first layer and the second layer to electrically connect the first layer and the second layer.

A further aspect of the present invention is a method for manufacturing a luminescence cell including first and second layers that emit light when voltage is applied between a first electrode and a second electrode. The method includes providing a transparent substrate; forming a transparent conductor layer on the transparent substrate; forming a first electroluminescence element precursor including two conductors, at least one of which is transparent, and the first layer, which contains a first luminescent material, between the two conductors; forming second electroluminescence element precursor including two conductors, at least one of which is transparent, and the second layer, which contains a second luminescent material, between the two conductors; forming a first electroluminescence element by connecting the transparent conductor of the first electroluminescence element precursor to the transparent conductor layer; and forming a second electroluminescence element that is physically separated from the first electroluminescence element by connecting the transparent conductor of the second electroluminescence element precursor to the transparent conductor layer.

A further aspect of the present invention is a method for manufacturing a luminescence cell including first and second layers that emit light when voltage is applied between a first electrode and a second electrode. The method includes providing a transparent substrate; forming a first electroluminescence element precursor including a first conductor, a second conductor, and the first layer, which contains a first luminescent material, between the first and second conductors, at least the first conductor being transparent; forming a second electroluminescence element precursor including a first conductor, a second conductor, and the second layer, which contains a second luminescent material, between the first and second conductors, at least the first conductor being transparent; bonding the first electroluminescence element precursor and the transparent substrate so that the first conductor of the first electroluminescence element precursor is connected to the transparent substrate; bonding the second conductor of the second electroluminescence element precursor and the transparent substrate so that the first electroluminescence element precursor is physically separated; and connecting the second conductor of the first electroluminescence element and the second conductor of the second electroluminescence element with a conductor.

A further aspect of the present invention is a method for manufacturing a luminescence cell including first and second layers that emit light when voltage is applied between a first electrode and a second electrode. The method includes providing a substrate; forming a conductor layer on the substrate; forming a first electroluminescence element precursor including a first conductor, a second conductor, and the first layer, which contains a first luminescent material, between the first and second conductors, at least the first conductor being transparent; forming a second electroluminescence element precursor including a first conductor, a second conductor, and the second layer, which contains a second luminescent material, between the first and second conductors, at least the first conductor being transparent; forming a first electroluminescence element by bonding the conductor layer and the second conductor of the first electroluminescence element precursor; and forming a second electroluminescence element that is physically separated from the first electroluminescence element by bonding the conductor layer and the second conductor of the second electroluminescence element precursor.

A further aspect of the present invention is a method for manufacturing a luminescence cell including first and second layers that emit light when voltage is applied between a first electrode and a second electrode. The method includes providing a substrate; forming a first electroluminescence element precursor including a first conductor, a second conductor, and the first layer, which contains a first luminescent material, between the first and second conductors, at least the first conductor being transparent; forming a second electroluminescence element precursor including a first conductor, a second conductor, and the second layer, which contains a second luminescent material, between the first and second conductors, at least the first conductor being transparent; bonding the second conductor of the first electroluminescence element precursor and the substrate; bonding the second conductor of the second electroluminescence element precursor and the substrate so that the first electroluminescence element precursor is physically separated; and connecting the first conductor of the first electroluminescence element and the first conductor of the second electroluminescence element with a transparent conductor.

A further aspect of the present invention is a luminescence cell for use with a power source. The luminescence cell includes a conductor layer including a surface having a first region and a second region; an anode layer arranged above the first region of the conductor layer; a cathode layer arranged above the second region of the conductor layer and physically separated from the anode layer, the anode layer and the cathode layer being connectable to the power source; a first luminescent layer located between the first region and the anode layer; and a second luminescent layer located between the second region and the cathode layer and physically separated from the first luminescent layer. The anode layer, the first luminescent layer, the second luminescent layer, and the cathode layer are electrically connected in series via the conductor layer.

A further aspect of the present invention is a method for manufacturing a luminescence cell. The method includes providing a conductor layer including a surface having a first region and a second region distanced from the first region; arranging an anode layer above the first region of the conductor layer; arranging an cathode layer above the second region of the conductor; arranging a first luminescent layer between the first region and the anode layer; and arranging a second luminescent layer between the second region and the cathode layer so that the anode layer, the first luminescent layer, the second luminescent layer, and the cathode layer are electrically connected in series via the conductor layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
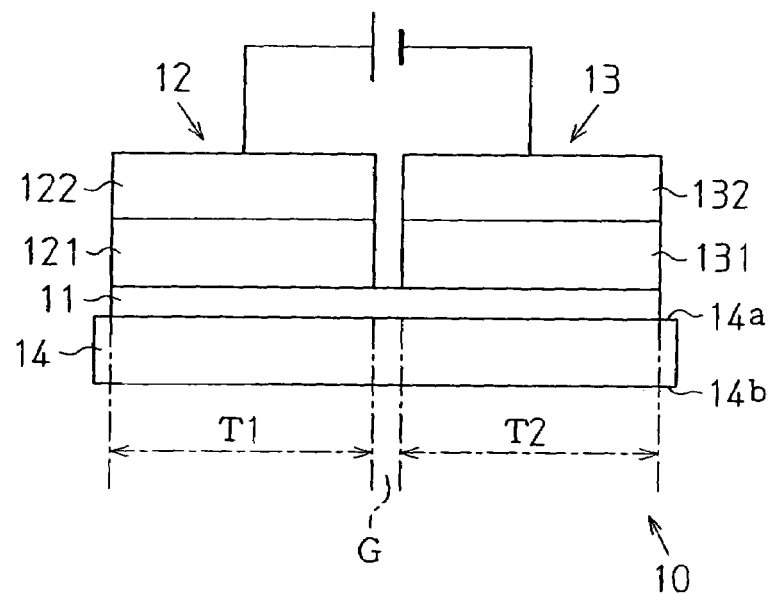
FIG. 1 is a cross sectional view of an organic EL cell according to a first embodiment of the present invention.

The term "transparent" used herein refers to the property of transmitting all of or one part of the light emitted from a first layer and a second layer. That is, the transparent member transmits light of the entire wavelength or light of only one part of the wavelength of the light emitted from the first layer and the second layer. The transmittance of the transparent member may be smaller than 100% as long it is greater than 0%. The transmittance of the transparent member is preferably equal to or greater than 10%, more preferably equal to or greater than 50%, and yet more preferably equal to or greater than 70%. The transmittance may be different for each wavelength or may be the same for the entire visible wavelength.

The phrase "the structure of the layer is generally the same" used herein means that the operation or the function are the same with respect to each other. This includes a case in which when the first layer is configured in the order of hole injection transport sublayer, light emitting sublayer and electron injection transport sublayer, in the second layer, the function is separated into the hole injection sublayer and the hole transport sublayer in place of the hole injection transport sublayer. This further includes a case in which one layer is consisted of a first set of sublayers and the other layer is consisted of a second set of sublayers in which one or more sublayers of the first set are omitted or substituted to other sublayers. The second set of sublayers may include one or more other sublayers in addition to the sublayers of the first set.

The phrase "the structure of the layer is generally the same" used herein includes a case in which the structure of the corresponding sublayers in the first layer and the second layer are substantially the same. The corresponding sublayers in the above example refers to the layers in which the function and/or the structure is generally the same as in the hole transport injection sublayers, light emitting sublayers, electron injection transport sublayers. For instance, in the hole injection transport sublayer of the first layer and the hole injection sublayer of the second layer, at least one of the constituting material, the thickness, or the film forming method is generally the same. The phrase "the structure of the layer is generally the same" further includes a case in which one or more constituent elements in one of the layers are generally the same to those of other layers. If the constituting material is generally the same, the base molecular structure of the material is the same (e.g., same derivative), and the main components composing the layer or the material (dielectric) determining the property of the layer is the same. Further, materials in which the light emitting characteristics (peak wavelength or chroma) are substantially the same, and the materials in which ionization potential or electron affinity are substantially the same are also considered as generally the same material.

The film forming method generally being the same includes, not only using the same film forming technique such as, sputtering and deposition to slightly change or have the same film forming conditions, but also includes respectively using the film forming technique of the same type of film forming category.

The phrase "peak wavelength is generally the same" refers to a case in which at least one of the peak wavelengths is generally the same wavelength when a plurality of peak wavelengths exists in the light emitted from each layer or from one of the layers.

The EL cell according to a first embodiment of the present invention will now be explained.

The same or similar components are designated with the same reference characters. The dimension and scale for each illustrated member may differ from the actual dimension.

Figure 2:
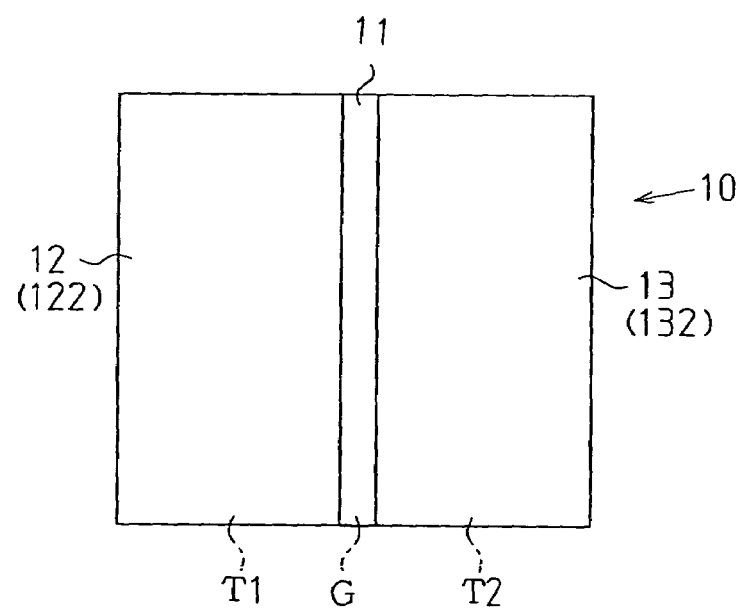
FIG. 2 is a plan view of the organic EL cell shown in FIG. 1 viewed from a light entering surface.

FIG. 1 is a cross sectional view of an organic EL cell 10. FIG. 2 is a plan view of the organic EL cell 10 viewed from a light entering surface 14a.

The structure of the organic EL cell 10 will first be explained with reference to FIG. 1 and FIG. 2.

As shown in FIG. 1, in the organic EL cell 10, a transparent conductor 11 is formed on the light entering surface 14a of a transparent substrate 14. A first organic EL element 12 is formed on a first region T1 in the transparent conductor 11. A second organic EL element 13 is formed on a second region T2 in the transparent conductor 11. The first organic EL element 12 means a structure constituting the transparent conductor 11, a first organic layer 121, and a first electrode 122. The second organic EL element 13 means a structure constituting the transparent conductor 11, a second organic layer 131 and a second electrode 132.

The first organic layer 121 and the first electrode 122 are laminated in order on the first region T1. The second organic layer 131 and the second electrode 132 are laminated in order on the second region T2.

The first organic layer 121 and the first electrode 122 are physically separated from the second organic layer 131 and the second electrode 132. In the organic EL cell 10, a gap or groove G is formed between the first organic layer 121 and the second organic layer 131, and between the first electrode 122 and the second electrode 132.

As shown in FIG. 2, in the organic EL cell 10, the transparent conductor 11 is substantially square plate or layer, and the shapes of the first region T1 and the second region T2 are substantially rectangular, respectively. The areas of both regions T1 and T2 are substantially the same. Further, the total area of the area of the first region T1 and the area of the second region T2 is substantially the same as the area of the surface of the transparent conductor 11 contacting the first organic layer 121 and the second organic layer 131.

That is, the first region T1, the second region T2, and the gap G between both regions are arranged on one surface of the transparent conductor 11. Preferably, the gap G is sufficiently narrow. The width of the gap G may be of any size as long as the first organic layer 121 and the first electrode 122 do not physically contact the second organic layer 131 and the second electrode 132, respectively. The width of the gap G is determined to be the width in which the corresponding ones are not short-circuited, or to be the width in which the leakage electric field and the magnetic field do not affect the corresponding ones.

The first organic layer 121 contains an organic luminescent material (first luminescent material) that emits light when voltage is applied across the first electrode 122 and the transparent conductor 11. The second organic layer 131 contains an organic luminescent material (second luminescent material) that emits light when voltage is applied across the second electrode 132 and the transparent conductor 11.

The operating mechanism of the organic EL cell 10 will now be explained.

As shown in FIG. 1, the first electrode 122 and the second electrode 132 are connected to a direct current power source. In the present embodiment, the first electrode 122 is the anode and the transparent conductor 11 is the cathode in the first organic EL element 12. In the second organic EL element 13, the transparent electrode 11 is the anode and the second electrode 132 is the cathode.

In the first organic layer 121, the holes are injected from the first electrode 122 and the electrons are injected from the transparent conductor 11. In the second organic layer 131, the holes are injected from the transparent conductor 11, and the electrons are injected from the second electrode 132. In each the first organic layer 121 and the second organic layer 131, the holes and the electrons are recombined and the energy level rises to an excited state. Light is emitted when returning from the excited state to the ground state. The light generated at the first organic layer 121 and the second organic layer 131 is transmitted through the transparent conductor 11 and the transparent substrate 14 and exits outwards from the organic EL cell 10.

The second electrode 132 may be the anode and the first electrode 122 may be the cathode.

The advantages obtained by the organic EL cell 10 will now be explained and the variants thereof will also be explained.

The organic EL cell 10 is connected to the external power source at the surface opposite side of a light exiting surface 14b using the first organic layer 121 and the second organic layer 131 as a reference. That is, as shown in FIG. 1 and FIG. 2, when the organic EL cell 10 is viewed from the light exiting surface 14b, the wire connecting the EL cell 10 and the external power source is not visible. Further, the area of the non-light emitting part is extremely small compared to the area of the light emitting part in the light exiting surface 14b. This is because the electrode connected to the external power source, that is, the first electrode 122 and the second electrode 132 are arranged on the side opposite the light exiting surface 14b with the first organic layer 121 and the second organic layer 131 as the reference, as shown in FIG. 1.

Figure 3:
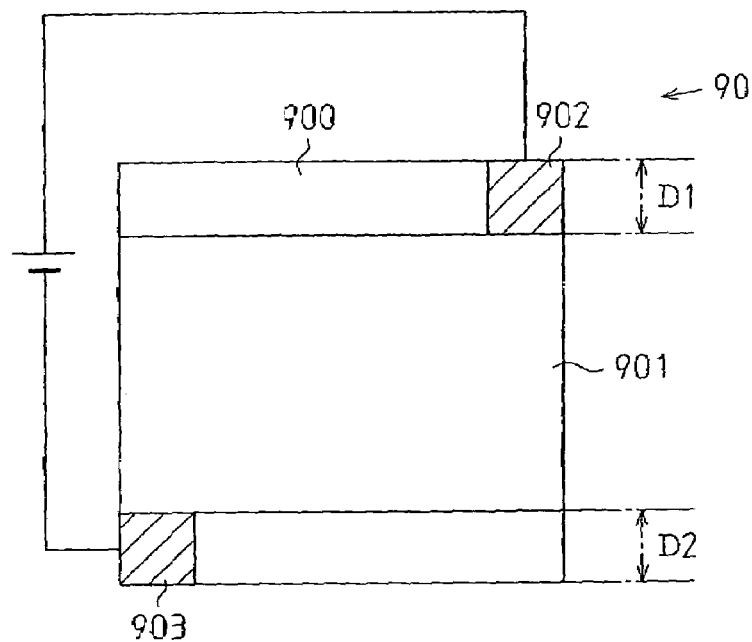
FIG. 3 is a plan view of a conventional bottom-emission type organic EL device.
Figure 4:
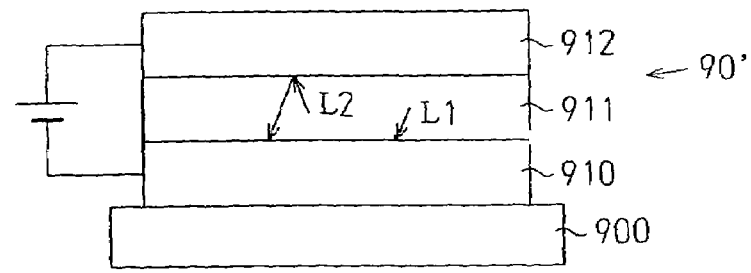
FIG. 4 is a cross sectional view for explaining the path of light generated in the conventional organic EL device.

FIG. 3 shows a general structure of a conventional organic EL device (a light-emitting device in which the organic EL element is laminated on the substrate). In an organic EL device 90 shown in FIG. 3, an organic EL element 901 is laminated on a substrate 900, and further, an anode 902 and a cathode 903 are arranged at the ends of the organic EL element 901. That is, the electrodes must be arranged on a plane substantially parallel to the light exiting surface of the organic EL element 901. Therefore, the regions D1 and D2 that do not emit light are created in the plane.

On the other hand, in the first organic EL cell 10, the region that does not emit light in the light exiting surface 14b is only the gap G region between the first region T1 and the second region T2, as shown in FIG. 1. Further, since the width of the gap G is extremely narrow as stated above, the light emitted from the first organic EL element 12 and/or the second organic EL element 13 is wave guided through the transparent conductor 11 and/or the transparent substrate 14, and the light is also extracted from the part corresponding to the gap G in the light exiting surface 14b.

Thus, in the organic EL cell 10, the non-light emitting region is zero or substantially zero in generally the same plane as the light exiting surface 14b.

Therefore, in the organic EL cell 10 in which the area of the light emitting region is the same as the organic EL device 90 shown in FIG. 3, the surface area (area of the light exiting surface 14b) of the transparent substrate is smaller by regions D1 and D2 shown in FIG. 3. The light emitting region refers to the region that substantially emits light when the EL cell is viewed from the light exiting surface. In the example of the EL cell (or EL device) in which each layer is formed on the plane, it refers to the surface (region) where the organic layer contacts the transparent conductor or the transparent electrode, as shown in FIG. 1 to FIG. 3. More specifically, in the EL cell 10 of FIG. 1, the regions T1 and T2 are the light emitting regions, and in the device of FIG. 3, the region where the organic EL element 901 contacts the transparent substrate 900 is the light emitting region.

Each component of the organic EL cell 10 will now be explained in more detail.

The transparent substrate 14 is mainly a plate-shaped member supporting the first organic EL element 12 and the second organic EL element 13. The first organic EL element 12 and the second organic EL element 13 are generally manufactured as organic EL devices supported by the transparent substrate 14 since each of the constituting layers of the first organic EL element 12 and the second organic EL element 13 is very thin.

The transparent substrate 14 is a member on which the first organic EL element 12 and the second organic EL element 13 are laminated, and thus the light entering surface 14a preferably is a smooth plane. However, the light entering surface 14a can be a rough surface. If the light entering surface 14a is a rough surface, each layer of the transparent conductor 11, the first organic layer 121 and the like is formed into a shape corresponding to the rough surface (bumps), and the following advantages are obtained.

The first organic layer 121 and/or the second organic layer 131 may be provided with bumps, and thus the amount of organic layers in a virtual plane substantially parallel to the light exiting surface 14b can be increased. Therefore, the amount of light emission per unit area in the virtual plane is increased.

If the first electrode 122 and the second electrode 132 have a bumpy shape, the traveling direction of the light with respect to the light exiting surface 14b is changed. Further, if the other layers also have a bumpy interface, the traveling direction of the light with respect to the light exiting surface 14b is changed. Consequently, the amount of light exits outwards from the organic EL cell 10 is increased compared to when the bumps are not provided. Thus, the current density for obtaining exiting light of the same amount as when obtained with the plane surface becomes small.

A known transparent substrate may be used for the transparent substrate 14 as long as the above performance is achieved. Generally, glass substrate or silicon substrate, ceramic substrate such as, quartz substrate, and plastic substrate are selected. Further, substrates made of a composite sheet combining a plurality of substrates of the same type or of a different type may be used.

The glass substrate generally has excellent heat resistance, moisture permeability, and surface smoothness, and blue plate glass, white plate glass or quartz glass may be selected. If the blue plate glass is selected, a passivation film made of inorganic materials such as, $SiO_2$ is arranged at least between the substrate 14 and the first organic EL element 12 and the second organic EL element 13 to prevent ions such as, alkali and alkaline earth contained in the glass from diffusing into the first organic EL element 12 and the second organic EL element 13.

The plastic substrate generally has characteristics of being thin, light, not easily broken, and flexible. Materials having a smooth surface, excellent heat resistance, solvent resistance, dimensional resistance, impact resistance, and moisture proof are selected for the plastic substrate. Further, material having excellent moisture proof is preferably used so as not to allow transmission of humidity and oxygen. Such material includes polyethylene, polypropylene, polyester, polysulfone, polyamide, polycarbonate, polyethylene terephthalate, polyethylene naphtalate, polyethersulfone, polyethersulfide, cycloolefinpolymer, polymethylmethacrylate etc.

The passivation film such as, silicon nitride film, silicon oxide film, and silicon oxide nitride film is laminated on the substrate 14 to enhance moisture proof. Further, the substrate prepared through a casting method is used to enhance smoothness of the surface.

An electrode material having electrical conductivity and being transparent is used for the transparent conductor 11. Examples of the material that may be used to form the transparent electrode includes ITO (indium-tin-oxide), IZO (indium-zinc-oxide) and the like. Further, metal oxide or metal nitride such as, tin oxide, zinc oxide, zinc aluminum oxide, and titanium nitride; metal, such as gold, platinum, silver, copper, aluminum, nickel, cobalt, lead, chromium, molybdenum, tungsten, tantalum, and niobium; and an alloy of these metals or alloy of copper iodide; electrode materials of conductive polymers such as polyanyline, polythiophene, polypyrole, polyphenylene vinylene, poly(3-methylthiophene), and polyphenylene sulfide can also be transparent if made into a thin-film.

The transparent conductor 11 may be formed by only one type of the above material, or may be formed by mixing a plurality of the same. The transparent conductor may also be a multilayered structure configured by a plurality of layers of the same composition or different compositions.

The thickness of the transparent conductor 11 depends on the material used, but is generally about 5 nm to 1 μm, preferably about 10 nm to 1 μm, more preferably about 10 nm to 500 nm, further preferably about 10 nm to 300 nm, and yet more preferably about 10 nm to 200 nm.

The transparent conductor 11 is formed using the above materials through known thin-film forming methods such as, a sputtering process, an ion plating method, a vacuum vapor deposition method, a spin coating method, and an electron beam vapor deposition method.

With regards to the first electrode 122 and the second electrode 132, one is the anode and the other is the cathode.

The anode is an electrode for injecting electron holes into the organic layer, and the cathode is an electrode for injecting electrons into the organic layer. The material for forming the anode is not limited as long as the properties described above are imparted to the anode. The materials that may be used to form the anode normally include metal, an alloy, an electrically conductive compound, a mixture of these substances, or a known material.

Examples of the material that may be used to form the anode include metal oxide or metal nitride, such as indium-tin-oxide (ITO), indium-zinc-oxide (IZO), tin oxide, zinc oxide, zinc aluminum oxide, and titanium nitride; metal, such as gold, platinum, silver, copper, aluminum, nickel, cobalt, lead, chromium, molybdenum, tungsten, tantalum, and niobium; and an alloy of these metals or alloy of copper iodide; conductive polymers such as polyanyline, polythiophene, polypyrole, polyphenylene vinylene, poly(3-methylthiophene), and polyphenylene sulfide.

For the reasons described above, the first electrode 122 and the second electrode 132 are preferably configured as a light reflective electrode. In this case, among the above materials, materials having properties that reflect light outward are selected. A metal, an alloy, or a metal compound is normally selected.

To prevent reflection of external light from decreasing contrast or deteriorating appearance, the first electrode 122 and the second electrode 132 may be provided with an absorbing property. For the first electrode 122 or the second electrode 132 to have an absorbing property, material showing an absorbing property when an electrode is formed may be selected from the above materials.

The anode may be formed of only one type of the above-described materials, or may also be formed by a mixture of a plurality of materials. Moreover, a multilayered structure constituted of a plurality of layers of the same composition or different compositions may also be formed.

The thickness of the anode is preferably about 5 nm to 1 μm, more preferably about 10 nm to 1 μm, further preferably about 10 nm to 500 nm, yet more preferably about 10 nm to 300 nm, and most preferably about 10 to 200 nm.

The anode is formed using the above materials through known thin-film forming methods such as a sputtering process; an ion plating method, a vacuum vapor deposition method, a spin coating method, and an electron beam vapor deposition method.

In order to clean the surface of the anode, UV ozone cleaning or plasma cleaning may also be carried out.

In order to inhibit short-circuits or defects of the organic EL device, surface roughness of the anode may be optimized through a method of miniaturizing the particle diameter or a method of polishing the formed film.

The material for forming the cathode used in the known organic EL device is selected for the material for forming the cathode, and a metal or an alloy, conductive compounds, the mixture thereof and the like are selected.

As the above electrode substances, for example, lithium, sodium, magnesium, gold, silver, copper, aluminium, indium, calcium, tin, ruthenium, titanium, manganese, chromium, yttrium, aluminium-calcium alloys, aluminium-lithium alloys, aluminium-magnesium alloys, magnesium-silver alloys, magnesium-indium alloys, lithium-indium alloys, sodium-potassium alloys, sodium-potassium alloys, magnesium/copper mixtures, and aluminium/aluminium oxide mixtures can be used. Further, the anode materials may be used for the cathode.

For the cathode arranged at a backside of the EL cell 10, among the above materials, materials having properties that reflect light outward are preferably selected, and a metal, an alloy or a metal compound is normally selected. Further, a material having light absorptivity may be selected as with the anode to enhance the contrast.

A buffer layer containing copper phthalocyanine and the like is arranged between the cathode and the organic layer 121 or 131 to prevent light emitting layers from being damaged by plasma when sputtering conductive oxide of the cathode.

The cathode may be formed by only one of the above materials or by a plurality of the same. For example, if 5% to 10% of silver or copper is added to magnesium, it is possible to prevent the cathode from being oxidized and enhance adhesion between the cathode and the organic layer.

Further, the cathode may have a multi-layered structure composed of a multiple layers having the same composition or different compositions.

For example, the cathode may be configured as follows.

To prevent oxidization of the cathode, a protective layer formed of a corrosion-resistant metal is provided at a portion of the cathode that is out of contact with the organic layer.

Preferably, the protective layer is formed of silver or aluminum.

To reduce the work function of the cathode, an oxide, a fluoride, or a metal compound, which has a small work function, is inserted into an interface portion between the cathode and the organic layer.

For example, the cathode that is used may be formed of aluminum, with lithium fluoride or lithium oxide inserted in the interface portion.

The cathode may be formed by any of the known thin layer-forming methods, such as the vacuum vapor deposition method, the sputtering method, the ionization vapor deposition method, the ion plating method, and the electron beam vapor deposition method.

An auxiliary electrode may of course be arranged. The auxiliary electrode is arranged so as to electrically connect with the anode and/or cathode, and is made of a material having a volume resistivity lower than the connecting electrode. When the auxiliary electrode is formed with such material, the volume resistivity of the entire electrode including the auxiliary electrode is-lowered and the maximum difference of the magnitude of the current flowing through each point constituting the organic layer becomes smaller than when the auxiliary electrode is not included.

The materials for forming the auxiliary electrode include tungsten (W), aluminum (Al), copper (Cu), silver (Ag), molybdenum (Mo), tantalum (Ta), gold (Au), chromium (Cr), titanium (Ti), neodymium (Nd), and the alloys thereof.

Examples of such alloys include alloys of Mo—W, Ta—W, Ta—Mo, Al—Ta, Al—Ti, Al—Nd, and Al—Zr. Further, the compounds of metal and silicon, $TiSi_2$, $ZrSi_2$, $HfSi_2$, $VSi_2$, $NbSi_2$, $TaSi_2$, $CrSi_2$, $WSi_2$, $CoSi_2$, $NiSi_2$, $PtSi$, $Pd_2Si$ etc. are also preferable as the materials for configuring the auxiliary wiring layer. The configuration in which the above metal or silicon compounds are respectively laminated may also be used.

The auxiliary electrode may be a single-layer film made of the above material, but may preferably be a multilayered film of two or more kinds to enhance the stability of the film. The multilayered film may be formed using the above metal or the alloys thereof. For example, the combination may be Ta layer, Cu layer and Ta layer, or Ta layer, Al layer and Ta layer in case of three layers; and Al layer and Ta layer, Cr layer and Au layer, Cr layer and Al layer, or Al layer and Mo layer in case of two layers.

The stability of the film is the property of maintaining low volume resistivity while being not easily corroded by the liquid used in the process during etching. If the auxiliary electrode is composed of Cu or Ag, the volume resistivity itself of the auxiliary electrode is low but is easily corroded.

The stability of the auxiliary electrode is enhanced by laminating a film of a metal having excellent corrosion resistivity such as Ta, Cr, Mo and the like on both or one of the upper part or the lower part of the metal film composed of Cu or Ag.

The thickness of the auxiliary electrode is preferably within the range of 100 nm to a few 10 µm, and more preferably within the range of 200 nm to 5 µm.

This is because if the thickness is less than 100 nm, the electric resistance becomes greater and is not preferable as the auxiliary electrode, and if the thickness is greater than 10 µm, the film can not be easily planarized and may cause defects in the organic EL elements 12 and 13.

The width of the auxiliary electrode is preferably within a range of for example, 2 µm to 1000 µm, and more preferably within a range of 5 µm to 300 µm.

This is because if the width is less than 2 µm, the resistance of the auxiliary electrode becomes greater, and if the width is greater than 1000 µm, the light is inhibited from exiting outwards.

Various configurations and techniques applicable to the first electrode 122 and the second electrode 132 may, obviously, be used for the transparent conductor 11. The auxiliary electrode may be arranged on the transparent conductor 11, the above additive may be included, and the transparent conductor 11 may be formed using the materials for forming the cathode.

The first organic layer 121 and the second organic layer 131 are layers containing the organic luminescent material, and are layers that emit light when voltage is applied across the first electrode 122 and the second electrode 132, and is a layer of known layer structure and known material in the known organic EL device and is manufactured with a known manufacturing method.

The organic layer may have, for example, the following layer constitution.

(anode)/hole injection layer/hole transport layer/light emitting layer/electron transport layer/electron injection layer/(cathode);

(anode)/hole injection layer/hole transport layer/light emitting layer/electron injection transport layer/(cathode);

(anode)/hole injection transport layer/light emitting layer/electron transport layer/electron injection layer/(cathode);

(anode)/hole injection transport layer/light emitting layer/electron injection transport layer/(cathode);

(anode)/hole transport layer/light emitting layer/electron transport layer/electron injection layer/(cathode);

(anode)/hole transport layer/light emitting layer/electron injection transport layer/(cathode);

(anode)/light emitting layer/electron transport layer/electron injection layer/(cathode);

(anode)/light emitting layer/electron injection transport layer/(cathode); or (anode)/light emitting layer/(cathode).

Other layers forming a known organic layer may be provided.

Each of functions required for the organic layer may be realized by either a single layer or a plurality of layers in the organic layer:

electron injection function;

function for injecting electrons from electrode (cathode), or electron injection-characteristic;

hole injection function;

function for injecting holes from electrode (anode), or hole injection characteristic;

carrier transport function;

function for transporting at least either one of electrons and holes, or carrier transport characteristic, (the function for transporting electrons is referred to as the electron transport function, and the function for transporting holes is referred to as the hole transport function);

light emission function; and function for recombining injected and transported electrons with carriers to generate excitons (excited state) and produce light when returning to the ground state.

The layer structure from the first electrode 122 of the first organic layer 121 towards the transparent conductor 11 is generally the same as the layer structure from the transparent conductor 11 of the second organic layer 131 towards the second electrode 132. Thus, the performances (peak wavelength of the emitting light, chroma of the emitting light, life span of the element) of the first organic EL element 12 and the second organic EL element 13 are substantially the same, and the amount of light exiting from both elements are substantially the same.

The corresponding layers (e.g., hole injection transport layer and hole injection transport layer, hole injection layer or hole transport layer) may have substantially the same structure. Thus, the performances of the first organic EL element 12 and the second organic EL element 13 are substantially the same.

As stated above, if the layer structure and the structure of the corresponding layer are substantially the same, the color of the light exiting from the first organic EL element 12 and the color of the light exiting from the second organic EL element 13 are adjustable.

For instance, if both elements are designed so that each element emits light of different peak wavelengths, or emits light of different chroma, the color of the light exiting from the organic EL cell 10 is the additive color of the light exiting from the first organic EL element 12 and the second organic EL element 13.

Both elements may be configured so that each element emits light of substantially same peak wavelength, or emits light of substantially the same chroma. In this case, the organic EL cell in which substantially the entire surface of the light exiting surface 14b (light emitting region) of the transparent substrate 14 emits light is manufactured. This is because the light emitting region (total area of the area of the surface contacting the transparent conductor 11 of the first organic layer 121 and the area of the surface contacting the transparent conductor 11 of the second organic layer 131, which surfaces are hereinafter referred to as the "light emitting surface") with respect to the area of the light exiting surface 14b is extremely large compared to that in the conventional device. However, the area of one surface of the transparent conductor 11 and the area of the light emitting region are not, of course, necessarily the same.

If the area of the light emitting surface of the first organic EL element 12 and the area of the light emitting surface of the second organic EL element 13 are substantially the same, particularly, if both elements have substantially the same layer structure and the structure of the corresponding layers are substantially the same, the following advantages are obtained.

The light emitting peak wavelength and/or chroma of both elements is substantially the same for the reasons stated above.

The amount of light exiting from both elements is substantially the same. This is because the light emitting amount (amount of light) of the organic EL device is determined by the amount of current flowing through (e.g., refer to "Organic EL device and Industrialization forefront" under the editorship of Seizou Miyata published by NTS Inc. on Nov. 30, 1998, p. 46-47, FIG. 9) and because the amount of current flowing through both elements is substantially the same since both elements are connected.

An example will hereinafter be described in which the organic layer is constituted of a hole injection transport layer, a light emitting layer, and an electron injection transport layer, and a case where another constitution is employed will also be described.

<Hole Injection Transport Layer>

The hole injection transport layer, into which holes are injected from the anode and which transports the injected holes into the light emitting layer, is disposed between the anode and the light emitting layer. An ionization potential of the hole injection transport layer, which is set to be between the work function of the anode and an ionization potential of the light emitting layer, is usually set at 5.0 to 5.5 eV.

The organic EL device of FIG. 1 including the hole injection transport layer has the following properties.

Driving voltage is low.

Injection of holes into the light emitting layer from the anode is stabilized. Therefore, life of the device is extended.

Adhesion between the anode and the light emitting layer increases. Therefore, uniformity of the light emitting surface is improved.

Protrusions on the surface of the anode are coated. Therefore, device defects are reduced.

When the light emitted by the light emitting layer is outputted through the hole injection transport layer, the hole injection transport layer is formed to transmit the emitted light. Among the materials that can form the hole injection transport layer, the material transmitting the emitted light is appropriately selected when being formed into a thin film. In general, the transmittance of the hole injection transport layer with respect to the emitted light is preferably higher than 10%.

The material for forming the hole injection transport layer is not especially limited as long as the above-described properties are imparted to the hole injection transport layer. A material may be selected and used from the known materials used as the hole injection material of the photoconductive device and the known materials used in the hole injection transport layer of a conventional organic EL device.

Examples of the material for forming the hole injection transport layer include phthalocyanine derivatives, triazole derivatives, triarylmethane derivatives, triarylamine derivatives, oxazole derivatives, oxadiazole derivatives, stilbene derivatives, pyrazoline derivatives, pyrazolone derivatives, polysilane derivatives, imidazole derivatives, phenylenediamine derivatives, amino substituted chalcone derivatives, styrylanthracene derivatives, fluorenone derivatives, hydrazone derivatives, silazane derivatives, aniline copolymer, porphyrin compounds, polyarylalkane derivatives, polyphenylene vinylene and derivatives thereof, polythiophene and derivatives thereof, poly-N-vinylcarbazole derivatives, electroconductive polymeric oligomers such as thiophene oligomer, carbazole derivatives, quinacridone compounds, aromatic tertiary amine compounds, styrylamine compounds, and aromatic dimethylidene-based compounds.

Examples of the triarylamine derivatives include a dimer to tetramer of triphenylamine, 4,4'-bis[N-phenyl-N-(4"-methylphenyl)amino]biphenyl, 4,4'-bis[N-phenyl-N-(3"-methylphenyl)amino]biphenyl, 4,4'-bis[N-phenyl-N-(3"-methoxyphenyl)amino]biphenyl, 4,4'-bis[N-phenyl-N-(1"-naphthyl)amino]biphenyl, 3,3'-dimethyl-4,4'-bis[N-phenyl-N-(3"-methylphenyl)amino]biphenyl, 1,1-bis[4'-[N,N-di(4'-methylphenyl)amino]phenyl]cyclohexane, 9,10-bis[N-(4'-methylphenyl)-N-(4"-n-butylphenyl)amino]phenanthrene, 3,8-bis(N,N-diphenylamino)-6-phenylphenanthridine, 4-methyl-N,N-bis[4",4'"-bis[N',N"-di(4-methylphenyl) amino]biphenyl-4-yl]aniline, N,N"-bis[4-(diphenylamino) phenyl]-N,N'-diphenyl-1,3-diaminebenzene, N,N'-bis[4-(diphenylamino)phenyl]-N,N'-diphenyl-1,4-diaminobenzene, 5,5"-bis[4-(bis[4-methylphenyl]amino) phenyl]-2,2':5',2"-terthiophene), 1,3,5-tris(diphenylamino) benzene, 4,4',4"-tris(N-carbazolyl)triphenylamine, 4,4',4"-tris[N-(3'"-methylphenyl)-N-phenylamino]triphenylamine, 4,4',4"-tris[N,N-bis(4'"-tert-butylbiphenyl-4""-yl)amino] triphenylamine, and 1,3,5-tris[N-(4'-diphenylaminophenyl)-N-phenylamino]benzene.

Examples of the porphyrin compounds include porphine, 1,10,15,20-tetraphenyl-21H,23H-porphine copper(II), 1,10, 15,20-tetraphenyl-21H,23H-porphine zinc(II), and 5,10,15, 20-tetrakis(pentafluorophenyl)-21H,23H-porphine.

Examples of the phthalocyanine derivatives include silicon phthalocyanine oxide, aluminum phthalocyanine chloride, phthalocyanine (metal-free), dilithium phthalocyanine, copper tetramethyl phthalocyanine, copper phthalocyanine, chromium phthalocyanine, zinc phthalocyanine, lead phthalocyanine, titanium phthalocyanine oxide, magnesium phthalocyanine, and copper octamethyl phthalocyanine.

Examples of the aromatic tertiary amine compounds and styrylamine compounds include N,N,N',N'-tetraphienyl-4,4'-diaminophenyl, N,N'-diphenyl-N,N'-bis-(3-methylphenyl)-[1,1'-biphenyl]-4,4'-diamine, 2,2-bis(4-di-p-tolylaminophenyl)propane, 1,1-bis(4-di-p-tolylaminophenyl)cyclohexane, N,N,N',N'-tetra-p-tolyl-4,4'-diaminophenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminophenyl ether, 4,4'-bis(diphenylamino)quadriphenyl, N,N,N-tri(p-tolyl)amine, 4-(di-p-tolylamino)-4'-[4(di-p-tolylamino)styryl]stilbene, 4-N,N-diphenylamino-(2-diphenylvinyl)benzene, 3-methoxy-4'-N,N-diphenylamino stilbenzene, and N-phenylcarbazole.

Examples of carbazole derivatives include carbazole biphenyl, N-methyl-N-phenylhydrazone-3-methylidene-9-ethylcarbazole, polyvinylcarbazole, N-isopropylcarbazole, and N-phenylcarbazole.

The hole injection transport layer may be formed of one of the above-described materials, or may be formed of a mixture of a plurality of the above-described materials. Furthermore, the hole injection transport layer may have a multilayered structure constituted of a plurality of layers of the same composition or different compositions.

The hole injection transport layer is formed on the anode by the known thin-film forming methods such as a vacuum vapor deposition method, a spin coating method, a casting method, and a LB method. The thickness of the hole injection transport layer is preferably 5 nm to 5 μm.

<Light Emitting Layer>

The light emitting layer is constituted mainly of an organic material. The holes and electrons are injected into the light emitting layer on the sides of the anode and the cathode, respectively. The light emitting layer transports at least one of the holes and electrons to recombine the hole and electron, makes the exciton or to rise an excited state, and emits light when returning to the ground state.

Therefore, the material (organic material) for forming the light emitting layer includes the following functions.

A function capable of injecting holes from the hole injection transport layer or the anode.

A function capable of injecting electrons from the electron injection transport layer or cathode.

A function for transporting at least one of the injected holes and electrons by force of an electric field.

A function for recombining the electrons and holes to produce an excited state (exciton).

A function for producing the light when returning to the ground state from the excited state.

Representative examples of the material having the above-described functions include Tris(8-hydroxyquinolinato)aluminum(III) (Alq3) and Be-benzoquinolinol (BeBq2).

Other examples of the material include benzoxazole based fluorescent whitening agents such as 2,5-bis(5,7-di-t-pentyl-2-benzoxazolyl)-1,3,4-thiadiazole, 4,4'-bis(5,7-pentyl-2-benzoxazolyl)stilbene, 4,4'-bis[5,7-di-(2-methyl-2-butyl)-2-benzoxazolyl]stilbene, 2,5-bis(5,7-di-t-pentyl-2-benzoxazolyl)thiophine, 2,5-bis([5-α,α-dimethylbenzyl]-2-benzoxazolyl)thiophene, 2,5-bis[5,7-di-(2-methyl-2-butyl)-2-benzoxazolyl]-3,4-diphenylthiophene, 2,5-bis(5-methyl-2-benzoxazolyl)thiophene, 4,4'-bis(2-benzoxazolyl)bephenyl, 5-methyl-2-[2-[4-(5-methyl-2-benzoxazolyl)phenyl]vinyl]benzoxazolyl, and 2-[2-(4-chlorophenyl)vinyl]naphtho[1,2-d]oxazole; benzothiazole based fluorescent whitening agents such as 2,2'-(p-phenylene divinylene)-bis-benzothiazole; benzimidazole based fluorescent whitening agents such as 2-[2-[4-(2-benzimidazolyl)phenyl]vinyl]benzimidazole and 2-[2-(4-carboxyphenyl)vinyl]benzimidazole; 8-hydroxyquinoline based metallic complexes such as bis(8-quinolinol)magnesium, bis(benzo-8-quinolinol)zinc, bis(2-methyl-8-quinolinolato)aluminium oxide, tris(8-quinolinol)indium, tris(5-methyl-8-quinolinol)aluminium, 8-quinolinol lithium, tris(5-chloro-8-quinolinol)gallium, bis(5-chloro-8-quinolinol)calcium, and poly[zinc-bis(8-hydroxy-5-quinolinonyl)methane]; metal chelate oxynoid compounds such as dilithium epinedridione; styryl benzene based compounds such as 1,4-bis(2-methylstyryl)benzene, 1,4-(3-methylstyryl)benzene, 1,4-bis(4-methylstyryl)benzene, distyrylbenzene, 1,4-bis(2-ethylstyryl)benzene, 1,4-bis(3-ethylstyryl)benzene, and 1,4-bis(2-methylstyryl)2-methylbenzene; distyrylpyrazine derivatives such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, and 2,5-bis[2-(1-pyrenyl)vinyl]pyrazine; naphtalimide derivatives; perylene derivatives; oxadiazole derivatives; aldazine derivatives; cyclopentadiene derivatives; styrylamine derivatives; coumarin based derivatives; aromatic dimethylidine derivatives; anthracene; salicylate; pyrene; coronene; and phosphorescence luminescent materials such as fac-tris(2-phenylpyridine)iridium, bis(2-phenylpyridinato-N,C2')iridium(acetyl acetonate), 6-di(fluorophenyl)-pyridinate-N,C2')iridium (acetyl acetonate), iridium(III) bis[4,6-di(fluorophenyl)-pyridinate-N,C2']picolinate, platinum(II) (2-(4',6'-difluorophenyl)pyridinate N,C2')(2,4-pentadionate) platinum(II) (2-(4',6'-difluorophenyl)pyridinate N,C2')(6-methyl-2,4-heptadionate-O, O) and bis(2-(2'-benzo[4,5-a]thienyl)pyridinate-platinum(II) (2-(4',6'-difluorophenyl)pyridinate N,C3')iridium(acetyl acetonate).

The light emitting layer may contain a host and a dopant. The host is injected with the carrier, and is brought into an excited state by the recombination of the holes and electrons. The host brought into the excited state transfers excitation energy to the dopant. The dopant produces the light when returning to the ground state. Alternatively, the host transports the carrier into the dopant, the recombination of the holes and electrons is carried out in the dopant, and the dopant produces the light when returning to the ground state.

The dopant is generally comprised of a fluorescent material or a phosphorescent material.

As long as the above functions are provided, a known material may be used as the host material. Examples of the material contained in the host include distyrylarylene derivatives, distyrylbenzene derivatives, distyrylamine derivatives, quinolinolato based metal complex, triarylamine derivatives, azomethine derivatives, oxadiazole derivatives, pyrazoloquinoline derivatives, silole derivatives, naphthalene derivatives, anthracene derivatives, dicarbazole derivatives, perylene derivatives, oligothiophene derivatives, coumarin derivatives, pyrene derivatives, tetraphenyl butadiene derivatives, benzopyran derivatives, europium complex, rubrene derivatives, quinacridone derivatives, triazole derivatives, benzoxazole derivatives, and benzothiazole derivatives.

The fluorescent material is a material having fluorescent properties, and emits light in shifting to the ground state from the excited state. The fluorescent material shifts to the ground state when obtaining the energy from the host, and can extract the light emission from a singlet in the excited state at room temperature. Alternatively, the fluorescent material shifts to the excited state when the holes and electrons transported from the host recombine with each other, and emits light in returning to the ground state. It is preferable that the fluorescent material has high fluorescent quantum efficiency. An amount of the fluorescent material with respect to that of the host is preferably at least 0.01% by weight and is preferably no more than 20% by weight.

As long as the above functions are provided, a known material may be used as the fluorescent material. Examples of the fluorescent material include europium complex, benzopyran derivatives, rhodamine derivatives, benz thioxanthene derivatives, porphyrin derivatives, coumarin derivatives, nailered, 2-(1,1-dimethylethyl)-6-(2-(2,3,6,7-tetrahydro-1,1,7,7-tetramethyl-1H,5H-benzo(ij)quinolidin-9-yl)ethenyl)-4H-pyran-4H-ylidene)propanedinitrile (DCJTB), DCM, quinacridone derivatives, distyrylamine derivatives, pyrene derivatives, perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene derivatives, and rubrene derivatives.

Examples of the coumarin derivatives include a compound represented by the following General Formula 1.

General Formula 1

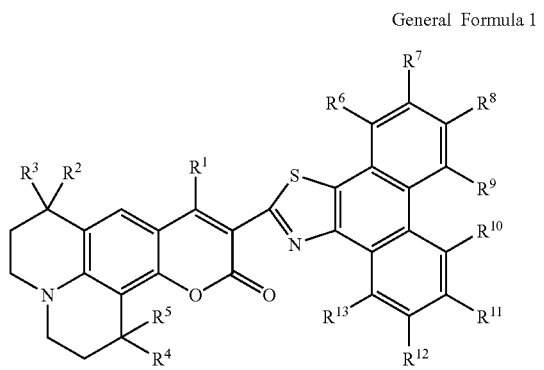

In General Formula 1, $R^1$ to $R^5$ each independently represent a hydrogen atom or a hydrocarbon group, and the hydrocarbon group may include one or a plurality of substituents. Examples of a preferable hydrocarbon group in $R^1$ to $R^5$ include a short chain aliphatic hydrocarbon group having up to five carbon numbers such as methyl group, ethyl group, propyl group, isopropyl group, isopropenyl group, 1-propenyl group, 2-propenyl group, butyl group, isobutyl group, sec-butyl group, tert-butyl group, 2-butenyl group, 1,3-butadienyl group, pentyl group, isopentyl group, neopentyl group, tert-pentyl group, and 2-pentenyl group; an alicyclic hydrocarbon group such as cyclopropyl group, cyclobutyl group, cyclopentyl group, cyclohexyl group, and cyclohexenyl group; an aromatic hydrocarbon group such as phenyl group, o-tolyl group, m-tolyl group, p-tolyl group, xylyl group, mesityl group, o-cumenyl group, m-cumenyl group, p-cumenyl group, and biphenylyl group. One or a plurality of hydrogen atoms in the hydrocarbon group may be substituted, for example, by an ether group such as methoxy group, ethoxy group, propxy group, isopropoxy group, butoxy group, isobutoxy group, sec-butoxy group, tert-butoxy group, pentyloxy group, isopentyloxy group, phenoxy group, and benzyloxy group; an ester group such as acetoxy group, bezoyloxy group, methoxycarbonyl group, ethoxycarbonyl group, and propoxycarbonyl group; a halogen group such as fluoro group, chloro group, bromo group, and iodo group. Depending on the application of the organic EL device, a preferable coumarin derivative is in which $R^2$ to $R^5$ are all aliphatic hydrocarbon groups. Especially, a coumarin derivative in which $R^2$ to $R^5$ are all methyl groups is superior in both physical properties and economical efficiency.

In General Formula 1, $R^6$ to $R^{13}$ each independently represent a hydrogen atom or a substituent. Examples of a substituent in $R^6$ to $R^{13}$ include an aliphatic hydrocarbon group having up to 20 carbon numbers such as methyl group, ethyl group, propyl group, isopropyl group, isopropenyl group, 1-propenyl group, 2-propenyl group, butyl group, isobutyl group, sec-butyl group, tert-butyl group, 2-butenyl group, 1,3-butadienyl group, pentyl group, isopentyl group, neopentyl group, tert-pentyl group, 1-methylpentyl group, 2-methylpentyl group, 2-pentenyl group, hexyl group, isohexyl group, 5-methylhexyl group, heptyl group, octyl group, nonyl group, decyl group, undecyl group, dodecyl group, and octadecyl group; an alicyclic hydrocarbon group such as cyclopropyl group, cyclobutyl group, cyclopentyl group, cyclohexyl group, cyclohexenyl group, and cycloheptyl group; an aromatic hydrocarbon group such as phenyl group, o-tolyl group, m-tolyl group, p-tolyl group, xylyl group, mesityl group, o-cumenyl group, m-cumenyl group, p-cumenyl group, benzyl group, phenethyl group, and biphenylyl group; an ether group such as methoxy group, ethoxy group, propoxy group, isopropoxy group, butoxy group, isobutoxy group, sec-butoxy group, tert-butoxy group, pentyloxy group, phenoxy group, and benzyloxy group; an ester group such as methoxycarbonyl group, ethoxycarbonyl group, propoxycarbonyl group, acetoxy group, and benzoyloxy group; a halogen group such as fluoro group, chloro group, bromo group, and iodo group; hydroxy group; carboxy group; cyano group; and nitro group.

More concrete examples of the coumarin derivatives include compounds represented by the following Chemical Formulas 1 to 24. Like these compounds, the coumarin derivatives including the compounds represented by General Formula 1 are high in melting point and glass transition temperature. As a result, the coumarin derivatives have high thermal stability.

Chemical Formula 1

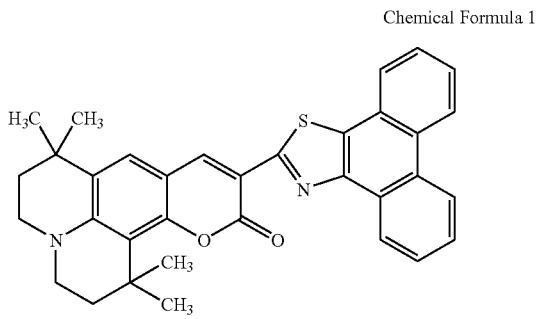

Chemical Formula 2

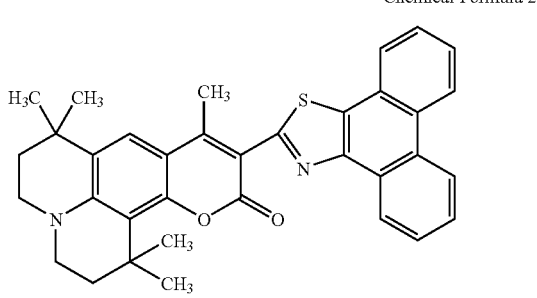

-continued
Chemical Formula 3
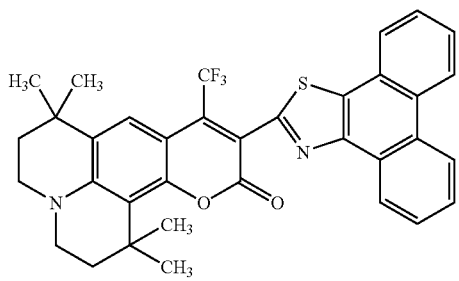
Chemical Formula 4
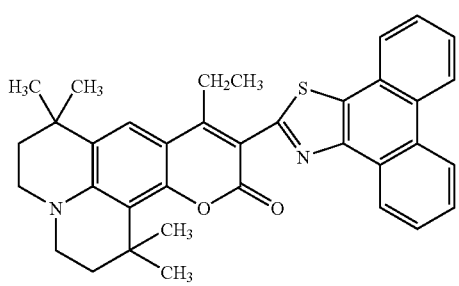
Chemical Formula 5
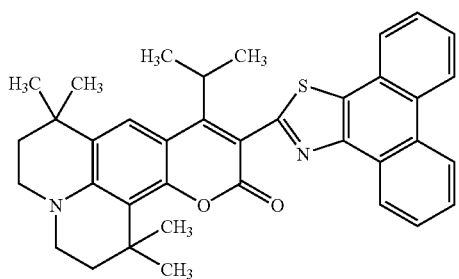
Chemical Formula 6
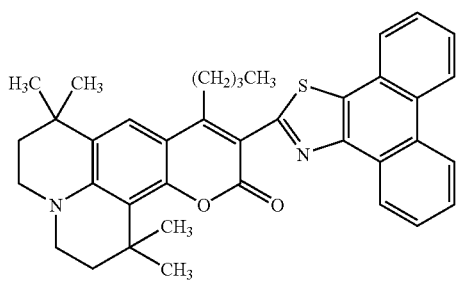
Chemical Formula 7
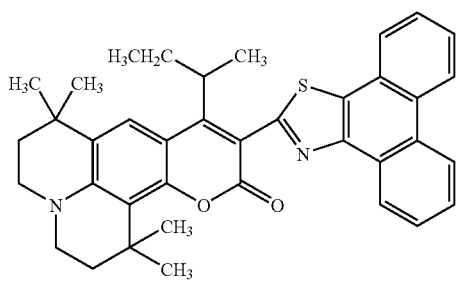
-continued
Chemical Formula 8
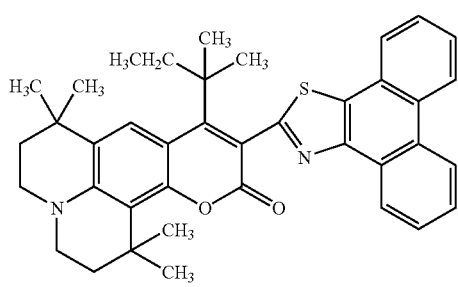
Chemical Formula 9
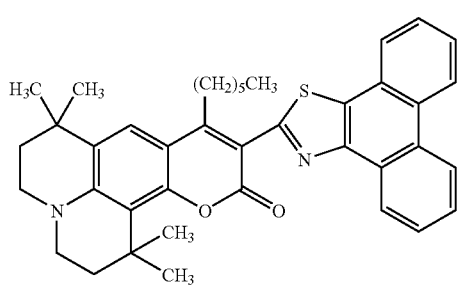
Chemical Formula 10
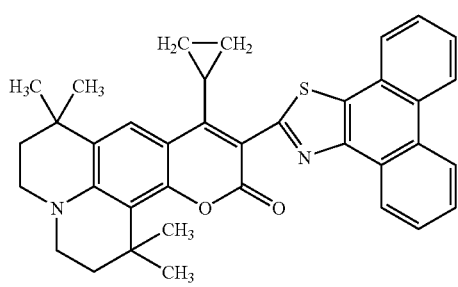
Chemical Formula 11
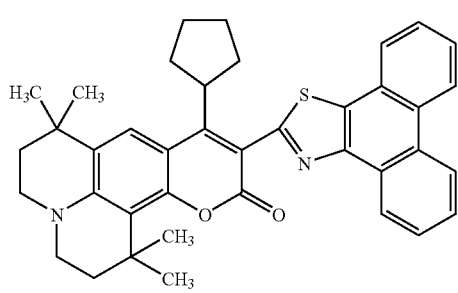
Chemical Formula 12
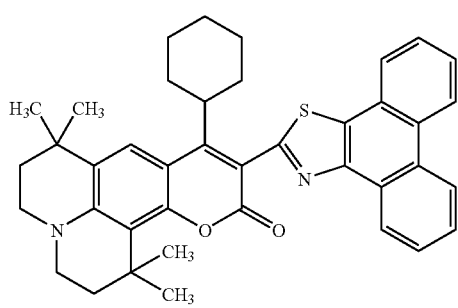

-continued
Chemical Formula 13
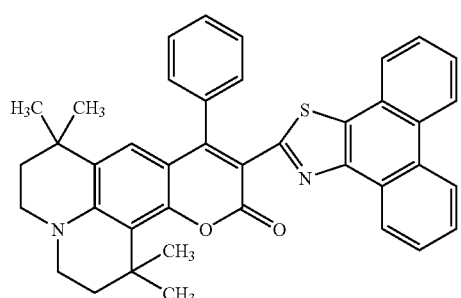
Chemical Formula 14
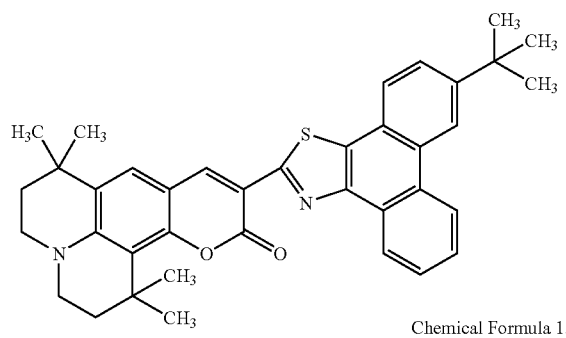
Chemical Formula 15
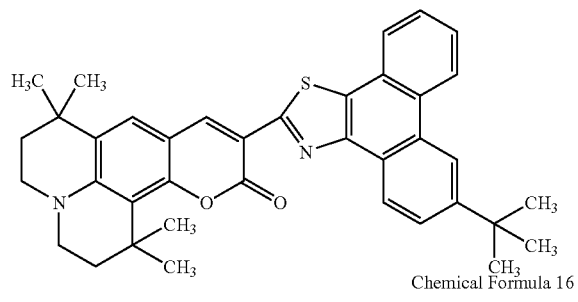
Chemical Formula 16
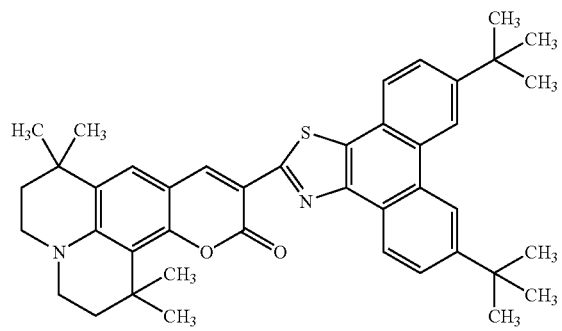
Chemical Formula 17
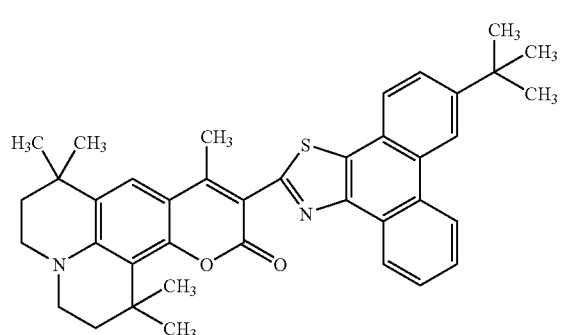
-continued
Chemical Formula 18
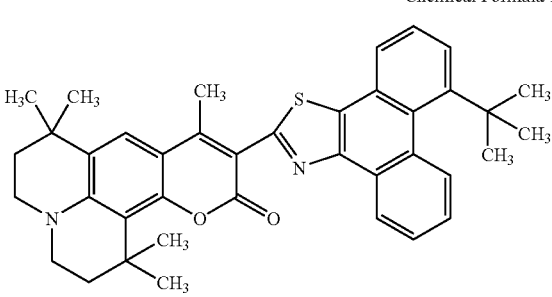
Chemical Formula 19
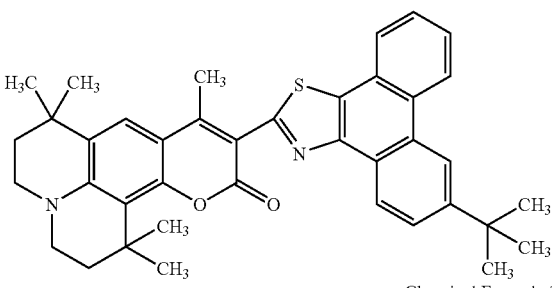
Chemical Formula 20
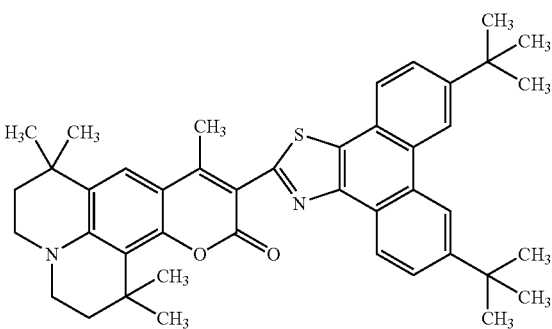
Chemical Formula 21
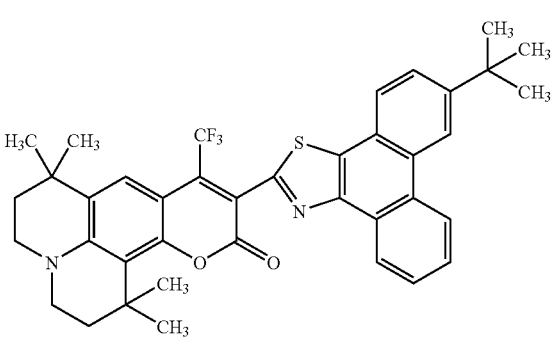
Chemical Formula 22
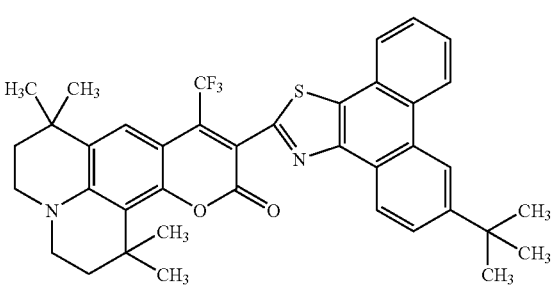

-continued

Chemical Formula 23

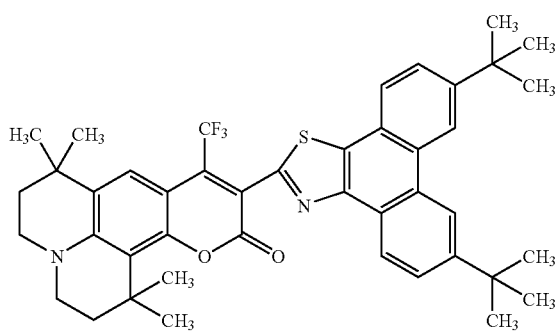

Chemical Formula 24

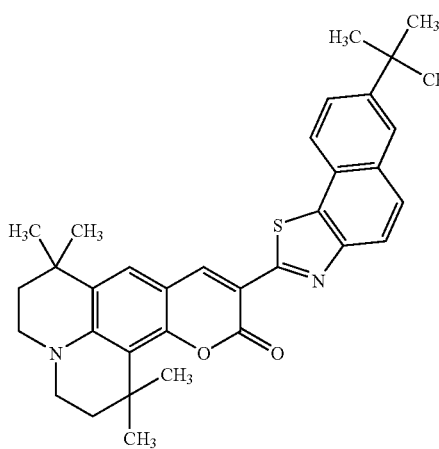

The phosphorescent material is a material having phosphorescent properties, and emits light in shifting to the ground state from the excited state. The phosphorescent material shifts to the ground state when obtaining the energy from the host, and can extract the light emission from a singlet and triplet in the excited state at room temperature. Alternatively, the phosphorescent material shifts to the excited state when the holes and electrons transported from the host recombine with each other.

An amount of the phosphorescent material with respect to that of the host is normally at least 0.01% by weight and no more than 30% by weight.

The phosphorescent material is not limited as long as it is a material that may use light emission from a singlet and triplet in the excited state at room temperature. A known material may be used as the phosphorescent material for light emission. Examples of the phosphorescent material include fac-tris(2-phenylpyridine)iridium, bis(2 -phenylpyridinato-N, C2')iridium(acetylacetonate), 6-di(fluorophenyl)-pyridinate-N,C2')iridium(acetylacetonate), iridium(III)bis[4,6-di (fluorophenyl)-pyridinate-N,C2']picolinate, platinum(II)(2-(4',6'-difluorophenyl)pyridinate N,C2')(2,4-pentanedionate), platinum(II)(2-(4',6'-difluorophenyl)pyridinate N,C2')(6-methyl-2,4-heptanedionate-O,O), and bis(2-(2'-benzo[4,5-a] thienyl)pyridinate-platinum(II)(2-(4',6'-difluorophenyl)pyridinate N,C3')iridium(acetylacetonate). In general, a phosphorescent heavy metal complex is used as the phosphorescent material in many cases.

For example, tris(2-phenylpyridine)iridium having green phosphorescent and 2,3,7,8,12,13,17,18-octaethyl-21H23H-prophin platinum(II) having red phosphorescent may also be used as the phosphorescent material. A central metal in these materials may be changed to another metal or nonmetal.

The light emitting layer may be formed on the hole injection transport layer by the known thin-film forming methods such as a vacuum vapor deposition method, a spin coating method, a casting method, and a LB method. Depending on the type of the material forming the light emitting layer, the thickness of the light emitting layer is preferably about 1 to 100 nm, more preferably about 2 to 50 nm.

When the single layer of the light emitting layer includes a plurality of dopants, the light emitting layer emits light having mixed colors, or emits two or more light beams. When the single layer of the light emitting layer includes a first dopant that has a lower energy level compared with that of the host and a second dopant that has a lower energy level compared with that of the first dopant, the energy moves from the host to a first dopant, and subsequently moves from the first dopant to the second dopant.

With the use of a mechanism in which the host transports the carrier to the dopant and causes the recombination of the transported carrier in the dopant, the efficiency of carrier movement is improved.

Chromaticity, chroma, lightness, luminance, and the like of the light emitted from the light emitting layer may be adjusted by selection of the type of material forming the light emitting layer, adjustment of the added amount of the dopant, and adjustment of the thickness of the light emitting layer.

For the blue light emitting layer, preferably, a dopant whose emission color is blue and host are mixed, for example, by co-vapor deposition, so that the blue light emitting layer may be formed.

Examples of a dopant whose emission color is blue include distyrylamine derivatives, pyrene derivatives, perylene derivatives, anthracene derivatives, benzoxazole derivatives, benzothiazole derivatives, benzimidazole derivatives, chrysene derivatives, phenanthrene derivatives, distyryl benzene derivatives, and tetraphenyl butadienes.

Examples of a host for the blue emission layer include distyrylarylene derivatives, stilbene derivatives, carbazole derivatives, triarylamine derivatives, anthracene derivatives, pyrene derivatives, coronene derivatives, and bis(2-methyl-8-quinolinolato)(p-phenylphenolato)aluminum (BAlq).

Examples of a dopant whose emission color is red and is used for the red emitting layer include europium complex, benzopyrane derivatives, rhodamine derivatives, benzothioxanthene derivatives, porphyrin derivatives, nailered, 2-(1,1-dimethylethyl)-6-(2-(2,3,6,7-tetrahydro-1,1,7,7-tetram-ethyl-1H,5H-benzo(ij)quinolidin-9-yl)ethenyl)-4H-pyran-4H-ylidene)propanedinitrile (DCJTB), and DCM.

Examples of a dopant whose emission color is green and is used for the green emitting layer include coumarin derivatives and quinacridone derivatives.

Examples of a host for the red light emitting layer and green light emitting layer include distyrylarylene derivatives, distyrylbenzene derivatives, distyrylamine derivatives, quinolinolato-based metal complex, triarylamine derivatives, oxadiazole derivatives, silole derivatives, dicarbazole derivatives, oligothiophene derivatives, benzopyran derivatives, triazole derivatives, benzoxazole derivatives, and benzothiazole derivatives. Preferable examples of the host include Alq3, tetramer of triphenylamine, and 4,4'-bis(2,2'-diphenylvinyl)biphenyl (DPVBi).

The light emitting layer may have a laminate structure. In this case, each layer may emit light having a wavelength different from that of at least another layer and/or light having a color differing from that of another layer.

The light emitting layer for emitting a plurality of colors is prepared so as to contain dopants for a plurality of colors, or to contain dopant and host each corresponding to a different color. In such method for preparing the light emitting layer, the light emitting layer is formed by mixing the material constituting the relevant layer with co-vapor deposition and the like, or dissolving or dispersing the constituting material into the binder resin, and then applying the solution or the dispersion liquid.

White may be expressed with red, green, and blue, or by emitting a color in complementary color relation such as, a combination of blue/yellow, a combination of light blue/orange, and a combination of green/purple. A color other than white may of course be expressed.

Techniques for adjusting the emission color of the light emitting layer include the following. At least one of the techniques may be used to adjust the emission color.

A technique for adjusting the emission color by adding, to the light emitting layer, a material for promoting or inhibiting light emission.

For example, when a so-called assistant dopant is added, which receives energy from the host and which moves the energy into the dopant, the energy is easily moved into the dopant from the host. The assistant dopant may be selected from known materials such as the materials described as examples of the host and dopant.

A technique for adjusting the emission color by adding a material for converting the wavelength of the light in a layer (including the transparent substrate 14) on the light exiting side of the light emitting layer.

The material may be a known wavelength converting material. Examples of this material include a fluorescent conversion material for converting the light into another light having a low energy wavelength. The type of the fluorescent conversion material is appropriately selected in accordance with the targeted wavelength of the light to be emitted from the organic EL device and the wavelength of the light emitted from the light emitting layer. The amount of the fluorescent conversion material added is appropriately selected in such a range that concentration extinction does not occur in accordance with the type of material, but an amount of about $10^{-5}$ to $10^{-4}$ mol/liter is preferable with respect to an uncured transparent resin. Only one type of fluorescent conversion material may be used, or a plurality of types may also be used. With the combined use of a plurality of types, by the combination, in addition to the blue, green, and red lights, a white color or a neutral-color light can be emitted. Examples of fluorescent conversion materials include the following materials (a) to (c).

(a) Concrete examples of fluorescent conversion materials excited by an ultraviolet ray to emit blue light include stilbene based pigments such as 1,4-bis(2-methylstyrene)benzene and trans-4,4'-diphenyl stilbene; coumarin based pigments such as 7-hydroxy-4-methyl coumarin; and aromatic dimethylidine based pigment such as 4,4-bis(2,2-diphenylvinyl)biphenyl.

(b) Concrete examples of fluorescent conversion materials excited by blue light to emit green light include coumarin pigments such as 2,3,5,6-1H,4H-tetrahydro-8-trifluoromethyl quinolidino(9,9a,1-gh)coumarin (coumarin153)

(c) Concrete examples of fluorescent conversion materials excited by light having wavelengths of blue to green to emit light having wavelengths of orange to red include cyanine based pigments such as 4-(dicyanomethylene)-2-methyl-6-(p-dimethylaminostyrylryl)-4H-pyran, 4-(dicyanomethylene)-2-phenyl-6-(2-(9-julolidyl)ethenyl)-4H-pyran, 4-(dicyanomethylene)-2,6-di(2-(9-julolidyl)ethenyl)-4H-pyran, and 4-(dicyanomethylene)-2-methyl-6-(2-(9-julolidyl)ethenyl)-4H-pyran and 4-(dicyanomethylene)-2-methyl-6-(2-(9-julolidyl)ethenyl)-4H-thiopyran; pyridine based pigments such as 1-ethyl-2-(4-(p-dimethylaminophenyl)-1,3-butadienyl)-pyridium-perchlorate (pyridine 1); xanthine based pigments such as rhodamine B and rhodamine 6G; and oxazine based pigments.

A technique for adjusting the emission color byf disposing color filters on the light exiting side of the light emitting layer.

The color filter adjusts the emission color by limiting the wavelengths of the transmitted light. As for the color filters, for example, known materials are used: cobalt oxide is used as blue filters, a mixed material of cobalt oxide and chromium oxide is used as green filters, and iron oxide is used as red filters. In this manner, color filters may be formed on the transparent substrate 14 using known thin-film forming methods, such as the vacuum vapor deposition method.

<Electron Injection Transport Layer>

The electron injection transport layer, which is disposed between the cathode and the light emitting layer, transports the electrons injected from the cathode to the light emitting layer. The electron injection transport layer imparts the following properties to the organic EL device.

Driving Voltage Drops.

Injection of the electron into the light emitting layer from the cathode is stabilized. Therefore, the life of the device is extended.

Adhesion between the cathode and the light emitting layer increases. Therefore, uniformity of the light emitting surface is improved.

Protrusions on the surface of the cathode are coated. Therefore, device defects are reduced.

A material for forming the electron injection transport layer is arbitrarily selected from the known materials which can be used as the electron injection material of the photoconductive device and the known material used in the electron injection transport layer of a conventional organic EL device. In general, a material is used whose electron affinity is between the work function of the cathode and the electron affinity of the light emitting layer.

Concrete examples of a material for forming the electron injection transport layer include oxadiazole derivatives such as 1,3-bis[5'-(p-tert-butylphenyl)-1,3,4-zzol-2'-yl]benzene and 2-(4-biphenylyl)-5-(4-t-butylphenyl)-1,3,4-oxadiazole; triazole derivatives such as 3-(4'-tert-butylphenyl)-4-phenyl-5-(4"-biphenyl)-1,2,4-triazole; triazine derivatives; perylene derivatives; quinoline derivatives; quinoxaline derivatives; diphenylquinone derivatives; nitro substituted fluorenone derivatives; thiopyran dioxide derivatives; anthraquinodimethane derivatives; thiopyran dioxide derivatives; heterocyclic tetracarboxylic acid anhydrides such as naphthalene perylene; carbodiimide; fluorenylidene methane derivatives; anthraquinodimethane derivatives; anthrone derivatives; distyryl pyrazine derivatives; silole derivatives; phenanthroline derivatives; imidazopyridine derivatives.

Further examples include organic metal complexes such as bis(10-benzo[h]quinolinolate)beryllium, beryllium salt of 5-hydroxyflavone, and aluminum salt of 5-hydroxyflavone; and metal complex of 8-hydroxyquinoline or its derivatives such as metal chelate oxynoid compounds containing a chelate of oxine (e.g., 8-quinolinol or 8-hydroxyquinoline). Examples of the metal chelate oxynoid compounds include tris(8-quinolinol)aluminium, tris(5,7-dichloro-8-quinolinol) aluminium, tris(5,7-dibromo-8-quinolinol)aluminium, and tris(2-methyl-8-quinolinol)aluminium. The examples also include a metal complex in which the central metal of the above-described metal complex is replaced with indium, magnesium, copper, calcium, tin, zinc, or lead. A metal-free complex, metal phthalocyanine, or a complex in which the terminal is substituted by an alkyl group, or sulfone group is also preferably used.

The electron injection transport layer may be formed of only one of the above-described materials, or a mixture of a plurality of materials. The electron injection transport layer may also have a multilayered structure constituted of a plurality of layers of the same composition or different compositions.

The electron injection transport layer may be formed by known thin-film forming methods such as a sputtering process, an ion plating method, a vacuum vapor deposition method, a spin coating method, and an electron beam vapor deposition method. The thickness of the electron injection transport layer is preferably about 5 nm to 5 µm.

When the electron injection transport layer is disposed on the light extraction side from the light emitting layer, the layer needs to be transparent with respect to the light to be extracted. The transmittance with respect to the light to be extracted is preferably higher than 10%.

<Other Layers and Additives>

In an organic EL device according to the present embodiment, the known layers other than the above-described layers may also be disposed, or known additives such as dopants may also be added to the constituting layers.

For example, when the layers described above in the layer constitution examples, such as the electron transport layer, hole transport layer, and hole injection layer, are disposed, the functions to be borne by these layers (carrier transport function, carrier injection function) are noted, an appropriate material is selected from the above-described materials, and the layers may be prepared in the same manner as in the above-described layers.

[Layer Disposed Between Layers]

A layer for enhancing the adhesion between the layers or enhancing electron or hole injection properties may also be disposed.

For example, a cathode interface layer (mixed electrode) obtained by the co-vapor deposition of the material forming the cathode and the material forming the electron injection transport layer may also be disposed between the layers. Accordingly, an electron injection energy barrier existing between the light emitting layer and the cathode is alleviated. The adhesion between the cathode and the electron injection transport layer is also enhanced.

The material for forming the cathode interface layer is not especially limited as long as the material imparts the above-described capabilities to the cathode interface layer. Examples of such material include fluoride, oxide, chloride, and sulfide of alkaline metal and alkaline earth metal such as lithium fluoride, lithium oxide, magnesium fluoride, calcium fluoride, strontium fluoride, and barium fluoride. The cathode interface layer may be formed of either a single material or a plurality of materials. The thickness of the cathode interface layer is preferably about 0.1 nm to 10 nm, more preferably about 0.3 nm to 3 nm.

As to the thickness of the cathode interface layer, the layer may be formed to be uniform, non-uniform, or insular, and may be formed by known thin-filter forming methods, such as the vacuum vapor deposition method.

A layer (block layer) for inhibiting movement of the holes, electrons, or exciton may also be interposed in at least one interface of the above-described layers. For example, a hole block layer may be disposed adjacent to the cathode side of the light emitting layer for the purpose of inhibiting the passage of the hole through the light emitting layer and efficiently recombining the electron in the light emitting layer. Examples of the material for forming the hole block layer include known materials such as triazole derivatives, oxadiazole derivatives, BAlq, and phenanthroline derivatives, but the material is not limited to these.

A layer (buffer layer) for alleviating the injection barrier of the holes and electrons may be interposed in at least one interface of the above-described layers. For example, the buffer layer may also be inserted between the anode and hole injection transport layer or between the organic layers laminated adjacent to the anode for the purpose of alleviating the injection barrier with respect to the hole injection. As the material for forming the buffer layer, known materials, such as copper phthalocyanine are used, but this is not especially limited.

[Doping of Hole Injection Transport Layer and Electron Injection Transport Layer]

The hole injection transport layer or the electron injection transport layer may be doped with organic emission materials or dopants such as a fluorescent material and phosphorescent material to emit the light.

[Doping of Alkaline Metal or Alkaline Metal Compound to Layer Adjacent to Cathode]

When the cathode is formed of metal, such as aluminum, the portion of the organic layer disposed adjacent to the cathode may be doped with alkaline metal or an alkaline metal compound in order to alleviate the energy barrier between the cathode and the light emitting layer. Since the organic layer is reduced by the added metal or metal compound to produce anions, the electron injection properties are enhanced, and the applied voltage drops. Examples of the alkaline metal compound include oxide, fluoride, and lithium chelate.

[Interposing of Layer for intensifying Emitted Light Intensity]

The layer for intensifying the intensity of the light emitted from the organic layer is arranged on the first organic EL element 12 or the second organic EL element 13. Such layer includes an optical resonating layer or a photonic crystal layer.

The optical resonating layer is a laminated structure (multilayered film mirror) composed of at least two half-mirrors and a transparent layer arranged between the half-mirrors. The distance between the half-mirrors is set to the optical distance for resonating the wavelength of the light exited outwards from the device. That is, the optical resonating layer is a layer that increases the light amount of the light of wavelength exiting outwards from the device and decreasing the exit of the light other than the light of the relevant wavelength. In other words, the optical resonating layer is a layer that sharpens the light exiting in the laminated direction of the half-mirror or in the thickness direction of the optical resonating layer.

Preferably, a reflecting plate for reflecting the light emitted from the light emitting layer or the light reflected from the half-mirror is arranged on the side opposite the light exiting surface 14b with the light emitting layer in between. The reflecting plate may be arranged separately from the organic layer, but preferably, the first electrode 122 or the second electrode 132 has a reflecting function and serves as the reflecting plate. When such a configuration is selected, the distance between at least one of the half-mirror and the reflecting plate is set to the optical distance for resonating the wavelength of the light exiting outwards from the device. Further, the optical resonating layer may be configured by only one half-mirror.

A known structure is adopted for the optical resonating layer, and is prepared using known materials and manufacturing methods to achieve such structure. The optical resonating layer may be configured in the following way.

The optical distance between the half-mirror and the reflecting plate and/or the optical distance between half-mirrors is preferably $(2\pi N-\phi-\theta)\lambda/4\pi$, and desirably satisfies 0.9 to 1.1 times such distance.

Here, N is a natural number, $\phi$ is a phase shift (radian unit) of the reflected light at the reflecting plate (or half-mirror on the side opposite the light exiting side), $\theta$ is a phase shift (radian unit) of the reflected light at the half-mirror (or half-mirror on the light exiting side), and $\lambda$ is a wavelength exiting outwards from the organic EL device. In such design, the light of wavelength $\lambda$ exiting outwards is resonated. That is, the light intensifies each other and light of wavelength $\lambda$ exits with directivity.

When resonance is achieved using the reflecting plate, and if the optical distance between the half-mirror and the reflecting plate is set as above, the optical distance from the surface of the reflecting plate of the light emitting layer is $(2M-1)\lambda/4\pi$. Here, M is a natural number, and $\lambda$ is as stated above. If the light emitting layer is arranged at such a position, the light source is arranged at the loop position of the standing wave existing between the half-mirror and the reflecting plate, and the above operations are obtained.

In the above configuration, the half-mirror transmits part of the light of wavelength $\lambda$ and reflects the rest. The metal thin-film having a reflecting function for the light of wavelengths $\lambda$ and the like is used for the material thereof.

The half-mirrors and the substance (filler layer) arranged between the half-mirrors of the optical resonating layer is formed by laminating a dielectric or an oxide and an organic material that transmits the above wavelength $\lambda$. More specifically, a high refractive index substance and a low refractive index substance are alternately laminated to form the dielectric multilayered film mirror. $TiO_2$, SnO and the like is used for the high refractive index substance and $SiO_2$ and the like is used for the low refractive index substance.

When using such a structure, if the refractive index of the half-mirror is NO and the refractive indexes of the layer and the atmosphere positioned above and below the half-mirror are NU, ND, the optical thickness of the half-mirror layer is set as below.

(i) $(2N-1)\lambda/4$, if NU>NO, ND>NO, or NU<NO, ND<NO, where N is a natural number.

(ii) $N\lambda/2$, if NU>NO>ND OR NU<NO<ND, where N is a natural number.

The desirable thickness is in the range of about 0.9 to 1.1 times the thickness of the above (i) and (ii).

In the optical resonating layer, the above material is deposited on the surface of the light exiting surface 14b of the high refractive index transparent layer through a manufacturing method suitable for the material, or known thin-film manufacturing methods such as, vapor deposition method and printing method. Further, after being arranged with the optical resonating layer, the resultant is laminated to the surface of the light exiting surface 4b of the high refractive index transparent layer with adhesion using thermo compression bonding or adhesion using adhesive agent.

A structure for resonating a plurality of wavelengths $\lambda 1$, $\lambda 2$, and etc., may be used.

In this case, a plurality of half-mirrors is arranged, and the optical distance between each half-mirror and/or between each half-mirror and the reflecting plate is designed according to the above equation, as stated above, but different with the above example in that $\lambda$ in the above equation becomes $\lambda 1$, $\lambda 2$, and etc. when designing the distances.

That is, light of wavelength $\lambda 1$ is resonated between certain half-mirrors (or between the half-mirror and the reflecting plate, used to mean the same hereinafter), and light of wavelength $\lambda 2$ is resonated between the other half-mirrors. The light of a plurality of wavelengths is thereby resonated to be intensified and the directivity becomes higher.

The photonic crystal is a substance/element device capable of freely controlling the light having a periodic structure of a length of approximately the wavelength of the light or electromagnetic wave. More specifically, the photonic crystal has a periodic structure of the length of approximately the wavelength of the light, and a photonic band-gap that does not permit the existence of the light of a certain wavelength range appears therein. The origin of the photonic band-gap can be explained similar to the origin of the band-gap with respect to the electron in the solid crystal, a forbidden band, that is, a band-gap in which the existence of the electron of a specific energy range is not permitted.

The band-gap with respect to the electron of when the atoms are aligned regularly in the solid crystal appears if the wavelength, of when the electron is considered a wave, is exactly the size of the interval between atoms, and thus the electron is subjected to Bragg reflection by the periodic potential within the crystal, and a state in which there is no energy is created.

Similarly, when propagating through the structure having periodical refracting index (dielectric constant) distribution of the length of approximately the wavelength of the light, the photonic band-gap that forbids the propagation of the light of a certain wavelength region is formed. This periodic structure may be any of one-dimensional, two-dimensional, or three-dimensional.

If a defect forms in the photonic crystal having a complete periodic structure, the end of the band forms a sleeve in the photonic band-gap, and a defect level (localized level) appears in the band. The light emitting property of the light emitting substance is strengthened by using the defect level. Further, the group velocity of the light is extremely small at the band end, and as a result, the light emitting property as the entire element is strengthened. Reference is made to the following articles.

"Suppression of field of light by photonic crystal", Surface Science, Vol. 22, No. 11, pp. 702-709, 2001).

"Property evaluation of photonic crystal organic EL device" 64th Japan Society of Applied Physics Academic Lecture Draft, p. 938.

"Preparation of organic semiconductor photonic crystal and optical properties" 64th Japan Society of Applied Physics Academic Lecture Draft, p. 938.

The configuration of the two-dimensional photonic crystal layer will now be specifically explained.

Figure 5A:
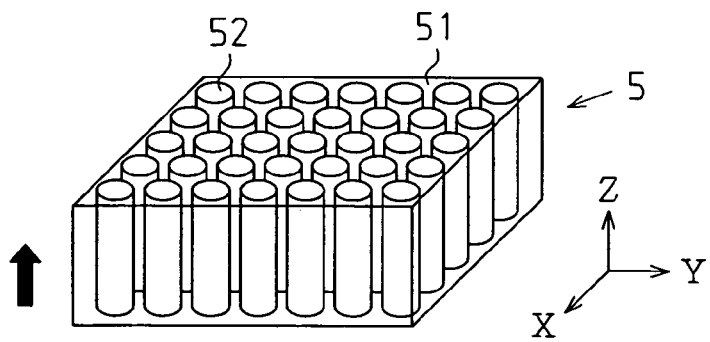
FIG. 5A is a perspective view of a two-dimensional photonic crystal layer.

As shown in FIG. 5A, a two-dimensional photonic crystal layer 5 is a layer including, in a transparent layer shaped (plate shaped) material (first dielectric) 51 that transmits the wavelength of the entering light, at locations (second dielectric) 52 that have a longitudinal direction in the direction of the thickness, that is, in the direction normal to the relevant layer, which transmits light, and that has a different refractive index (dielectric constant) from the above material in a periodically aligned manner. In FIG. 5A, the second dielectric 52 of the first dielectric 51 is also shown with a solid line for purposes of illustration.

The two-dimensional photonic crystal layer 5 is a structure that intensifies or sharpens one wavelength in the light emitted at the high refractive index transparent layer or the wavelengths within a predetermined range with the relevant wavelength as the center as stated above. That is, the refractive indexes of the first dielectric 51 and the second dielectric 52 and the arranging method (periodicity) of the second dielectric are calculated using the known photonic crystal technique and prepared using photolithography, electron beam lithography and the like.

Figure 5B:
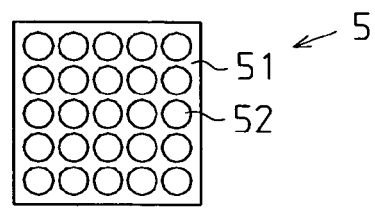
FIG. 5B is a plan view of the two-dimensional photonic crystal layer of FIG. 5A.
Figure 5C:
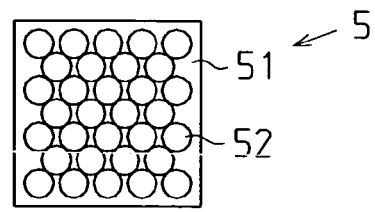
FIG. 5C is a plan view of an example of the two-dimensional photonic crystal layer.

The periodic structure of the second dielectric includes a tetragonal arrangement as shown in FIG. 5B or a triangular lattice arrangement as shown in FIG. 5C.

The material constituting the first dielectric 51 and the second dielectric 52 may be any material as long as each dielectric has a different refractive index with respect to each other, and an arbitrary glass material, semiconductor material, oxide material, organic material and the like is applicable.

Vapor, vacuum etc. may be considered as a material. That is, the two-dimensional photonic crystal layer 5 is prepared by opening a hole in the first dielectric 51, and enclosing vapor such as, gas and nitrogen in the hole, or forming a vacuum. Here, when such structure is adopted, the vapor enclosed in the hole is preferably a vapor that does not deteriorate or is less likely to deteriorate the organic layer, and nitrogen or a noble gas is preferably enclosed.

The organic EL cell 10 has the above configuration and each layer is prepared as stated above. One example of a method for manufacturing the organic EL cell 10 will now be shown.

The organic EL cell 10 is manufactured according to the following steps. The order of each of the following steps is freely changeable with another step unless otherwise stated.

The first method for manufacturing the organic EL cell 10 according to the present invention has the steps of:

forming the transparent conductor 11 on the light entering surface 14a of the transparent substrate 14;

forming the first organic layer 121 containing the organic luminescent materials on the first region T1 in the surface of the transparent conductor 11 on the opposite side of the surface (light emitting surface) contacting the transparent substrate 14;

forming the first electrode 122 on the surface of the first organic layer 121 on the opposite side of the surface contacting the transparent conductor 11;

forming the second organic layer 131 containing the organic luminescent materials on the second region T2 in the surface of the transparent conductor 11 on the opposite side of the surface contacting the transparent substrate 14;

forming the second electrode on the surface of the second organic layer 131 on the opposite side of the surface (light emitting surface) contacting the transparent conductor 11; and forming the gap G so that the first organic layer 121 and the second organic layer 131, and the first electrode 122 and the second electrode 132 are physically separated from each other by a predetermined distance.

Each step uses the film forming method corresponding to the related layer.

The gap G may be formed when forming the first organic EL element 12 and the second organic EL element 13. For instance, the masking method is used so that the conductive substance is not vapor deposited in the gap, or the printing method is used to form each layer so that the gap G is formed while preparing the first organic EL element 12 and the second organic EL element 13. Further, after both organic EL elements are formed, the gap G is formed using a known cutting means such as, laser, cutter, and the like.

The first organic EL element (precursor) or the second organic EL element (precursor) are manufactured, which are then adhered and laminated on the transparent conductor 11 to form the organic EL cell 10. The manufacturing method of appropriately performing the following steps is adopted. The steps include:

forming the transparent conductor 11 on the transparent substrate 14;

forming the first EL element precursor including the first organic layer 121 containing the first organic luminescent material between one conductor and another conductor (first electrode) 122, at least one of which being a transparent conductor;

forming the second EL element precursor including the second organic layer 131 containing the second organic luminescent material between one conductor and another conductor (second electrode) 132, at least one of which being a transparent conductor;

forming the first EL element 12 by bonding the first EL element precursor to the region T1 on the surface of the transparent conductor 11 on the opposite side of the surface contacting the transparent substrate 14 so that the transparent conductor is connected to the transparent conductor 11; and forming the second EL element 13 by bonding the second EL element precursor to the region T2 on the surface of the transparent conductor 11 on the opposite side of the surface contacting the transparent substrate 14 so that the transparent conductor is connected to the transparent conductor 11 and so as to be physically separated away from the first EL element 12.

A clearance is formed between the regions T1 and T2. One of the organic EL elements is manufactured using the organic EL element precursor as above, and the other organic EL element is manufactured by laminating each layer as previously mentioned.

A modification of the organic EL cell 10 will now be explained.

The modification already described may be used. Each of the above mentioned modification and the following modification may not necessarily be used, only one may be used, or a plurality of the same may be combined within a range not conflicting with each other.

In the organic EL cell 10 shown in FIG. 1, the transparent substrate 14 may not be arranged. The light emitted from the organic layer is thereby attenuated by the transparent substrate 14, allowing the light not extracted in the conventional organic EL device to be extracted.

When using such a configuration, the first organic layer 121 or the second organic layer 131 may be directly laminated on the transparent conductor 11 without using the transparent substrate 14 from the beginning, or the substrate may be eliminated through the known method of eliminating the substrate of the organic EL device using the sand blasting method, dry etching method, wet etching method and the like after the organic EL cell 10 is manufactured using the substrate 14.

The transparent substrate 14 with a thickness sufficient to protect the transparent conductor 11 is remained to protect the transparent conductor 11 from external atmosphere (particularly oxygen and moisture).

The transparent substrate 14 may not be arranged, and instead, other transparent protecting members may be arranged. The protecting member will be hereinafter described.

In the above examples, the shape and size of the first region T1 and the second region T2 are generally the same with respect to each other, but only the shape may generally be the same, or only the area may generally be the same. Particularly, if the area is the same, the amount of current flowing through the first organic EL element 12 and the second organic EL element 13 is the same, as stated above.

The shapes of the regions T1 and T2 may of course be shapes other than a rectangle.

Figure 6A:
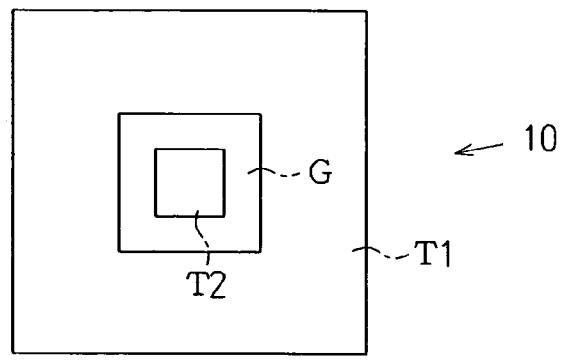
FIGS. 6A and 6B are plan views of the organic EL cell of a modified example.

As shown in FIG. 6A, the second region T2 may be a square region at the central part on one surface of the transparent conductor 11, and the first region T1 may be formed outside the region T2 on the relevant surface by way of the gap G.

Figure 6B:
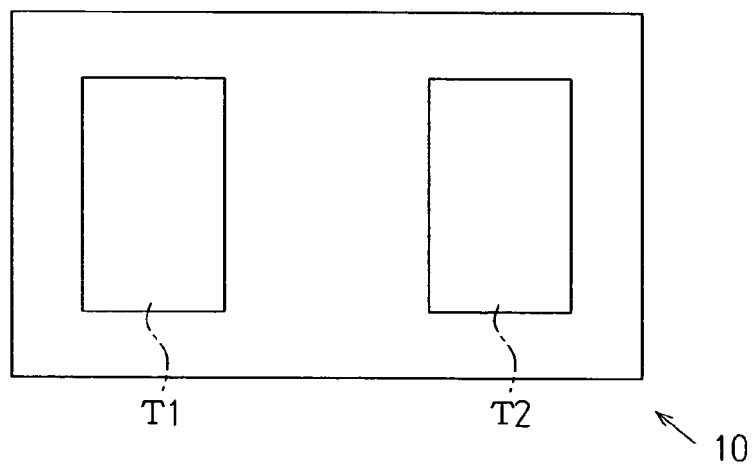

As shown in FIG. 6B, the area of one surface of the transparent conductor 11 is larger (so as not to be substantially the same area) than the total area of the area of the first region T1 and the area of the second region T2, as mentioned above.

Figure 7:
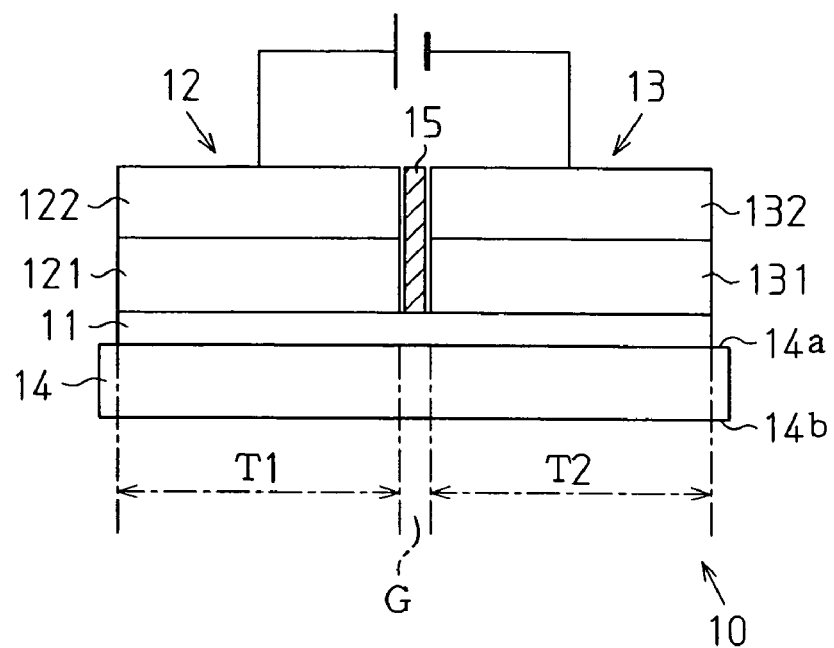
FIG. 7 is a cross sectional view of the organic EL cell with an insulation wall arranged in a gap G.

As shown in FIG. 7, for example, an insulation wall 15 having at least insulation is arranged in the gap G. Thus, the first organic layer 121 and the second organic layer 131, and the first electrode 122 and the second electrode 132 are reliably prevented from physically contacting each other. The insulation wall 15 is formed so as not to contact the first organic EL element 12 and the second organic EL element 13 as shown in FIG. 7, but may be formed so as to contact the same.

The insulation wall 15 is preferably transparent, and preferably has a diffusing function.

If the insulation wall 15 is transparent, the light emitted from the organic layer towards the other organic layer enters the other organic layer, or the light entering the insulation wall 15 at an angle greater than the critical angle for entering the insulation wall 15 is reflected. If the insulation wall 15 is transparent, the direction that the light travels with respect to the light exiting surface 14b is changed, and the amount of light exiting outwards from the light exiting surface 14b becomes high (light exiting efficiency).

A known diffusing means provided with a diffusing function may be arranged by including beads having a refractive index different from the main material constituting the insulation wall 15 in the insulation wall 15 or by arranging bumps of appropriate size on the wall surface of the insulation wall 15 and the like. This allows the traveling direction of the light to change with respect to the light exiting surface 14b and the light exiting efficiency to increase further.

The organic EL cell 10 is manufactured by the following steps when the insulation wall 15 is included. The order of each step can be freely set unless otherwise stated, similar to the above manufacturing method. The steps include:

forming the transparent substrate 11 on the transparent substrate 14;

forming the insulation wall 15 composed of an insulation material for partitioning the first region T1 and the second region T2 on the surface of the transparent conductor 11 on the opposite side of the surface contacting the transparent substrate 14;

forming the first organic layer 121 containing the first organic luminescent material on the first region T1 in the surface of the transparent conductor 11 on the opposite side of the surface contacting the transparent substrate 14;

forming the first electrode 122 on the surface of the first organic layer 121 on the opposite side of the surface contacting the transparent conductor 11;

forming the second organic layer 131 containing the second organic light emitting material on the second region T2 in the surface of the transparent conductor 11 on the opposite side of the surface contacting the transparent substrate 14; and forming the second electrode 132 on the surface of the second organic layer 131 on the opposite side of the surface contacting the transparent conductor 11.

The insulation wall 15 may be configured in any way as long as at least the surface is configured with the insulative member. The surface of the insulation wall precursor configured by the conductor made of metal and the like becomes insulative through oxidization after being arranged on the transparent conductor 11 or before being arranged on the transparent conductor 11. Further, the insulation wall 15 shaped projection (insulation wall precursor) is arranged on the transparent conductor 11, and at least the surface of such insulation wall precursor is made insulative through known methods.

As mentioned above, the properties of most of the organic layer are changed by external atmosphere (particularly oxygen and moisture), and thus the end thereof is preferably protected.

Figure 8A:
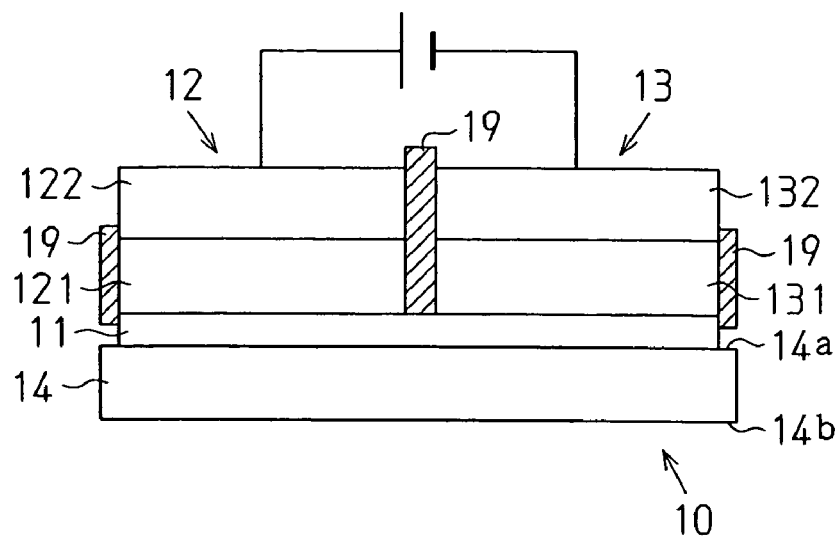
FIGS. 8A and 8b are schematic diagrams of the sealed organic EL cell.
Figure 8B:
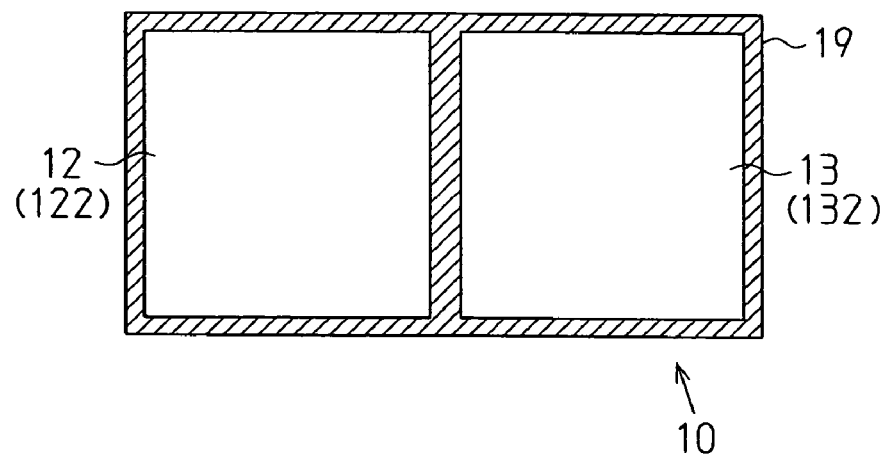

As shown in the cross sectional view of FIG. 8A, or the front view of FIG. 8B, the exteriorly exposed parts (ends) of the first organic layer 121 and the second organic layer 131 are sealed with a protective film, and the end of the gap G is sealed with the protective film (protective member) 19. The space (e.g., gap G) between the protective member 19 and each organic layer is an atmosphere not including oxygen or moisture, such as a nitrogen atmosphere or a vacuum.

The protective member 19 not only protects the first organic layer 121 and/or the second organic layer 131 but also protects other layers. The transparent conductor 11, for example, is protected. The protective member 19 to protect from influences other than oxygen and moisture such as external pressure and temperature change may also be included.

Examples of the material used for a protective layer (passivation layer) include organic polymeric materials, inorganic materials, and photo-setting resin, and which material may be used alone or as a combination of a plurality of materials. The above-described fluorescent conversion material may be added to the material for forming the seal layer. The seal layer may also have either a mono-layer structure or a multilayered structure.

Examples of the organic polymeric material include fluorine based resin of copolymers such as chlorotrifluoroethylene polymer, dichlorodifluoroethylene polymer, and copolymer of chlorotrifluoroethylene and dichlorodifluoroethylene; acrylic resin such as polymethyl methacrylate and polyacrylate; epoxy resin; silicone resin; epoxy silicone resin; polystyrene resin; polyester resin; polycarbonate resin; polyamide resin; polyimide resin; polyamideimide resin; polyparaxylene resin; polyethylene resin; and polyphenylene oxide resin.

Examples of the inorganic material include polysilazane, diamond thin film, amorphous silica, electrically insulating glass, metal oxide, metal nitride, metal carbide, and metal sulfide.

The above-described fluorescent conversion material may be added to the above materials.

The organic EL element may also be protected in inactive materials such as paraffin, liquid paraffin, silicone oil, fluorocarbon oil, and zeolite added fluorocarbon oil.

Needless to say, the organic EL element may be protected by can sealing. Concretely, for the purpose of cutting off moisture or oxygen from the outside, the organic layer may be sealed by seal members such as a seal plate and a seal container. The seal member may be disposed only on the rear-surface side (electrode side) of the organic EL element, or the whole organic EL element may also be coated with the seal member. When the organic layer can be sealed and the outside air can be cut off, the shape, size, or thickness of the seal member is not especially limited. Examples of the material for forming the seal member include glass; metal such as stainless steel and aluminum; plastic such as polychlorotrifluoroethylene, polyester, polycarbonate; and ceramic.

When the seal member is disposed in the organic EL element, a sealant or an adhesive may also be used. When the whole organic EL element is coated with the seal member, instead of using the sealant, the seal members may be mutually thermally bonded. Examples of the sealant include an ultraviolet setting resin, thermal setting resin, and two-liquid type setting resin.

Furthermore, a moisture absorbent or inactive solution may also be inserted in a space between the sealed container and the organic EL element. Examples of the moisture absorbent include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide. Examples of the inactive solution include paraffin; liquid paraffin; fluorine-based solvent such as perfluoroalkane, perfluoroamine, and perfluoroether; chlorine-based solvent; and silicone oil.

The first electrode 122 and the second electrode 132 have a protection function (function for preventing entry/unlikely entry of at least moisture and oxygen) to prevent entry of oxygen or moisture to the first organic layer 121 or the second organic layer 131 from the first electrode 122 or the second electrode 132.

If, for example, the first electrode 122 and the second electrode 132 are made of a material such as aluminum to a sufficient thickness, the probability of oxygen or moisture entering the first organic layer 121 or the second organic layer 131 is extremely low.

The protection function is also achieved by protecting the first electrode 122 and the second electrode 132, besides the part (end) connected to the external power source, with the protective member 19.

A light diffusing member including a light diffusing function is arranged on the light exiting surface 14b and/or the side opposite the relevant surface 14b than the first organic layer 121 and the second organic layer 131.

The light diffusing plate or the diffusion plate is arranged on the light exiting surface 14b of the transparent substrate 14, or a plurality of miniature bumps is formed on the light exiting surface 14b to provide a light diffusing function to the transparent substrate 14. By providing the light diffusing member on the light exiting surface 14b rather than the organic layer, the light exiting from the light exiting surface 14b becomes uniform compared to when the light diffusing member is not provided.

If the light diffusing member including the diffusing function is arranged on the side opposite the light exiting surface 14b that is, on the electrode side with the organic layer in between, direction of light travel with respect to the light exiting surface 14b is changed, as stated above, and light that does not exit outwards from the light exiting surface 14b when the light diffusing member is not provided is extracted.

The light diffusing function may of course be achieved by including a plurality of bumps of appropriate size on at least one layer (component) constituting the organic EL cell not mentioned above, or by dispersing the member (e.g., beads, etc.) of a refractive index different from the member constituting the relevant layer.

The organic layer may be changed to a first inorganic layer, and the second organic layer may be changed to the second inorganic layer. In this case, the inorganic luminescent material is contained in the inorganic layer, and the inorganic light emitting layer containing the inorganic luminescent material is designed so as to be held between the insulation layers. Further, if at least one of the EL elements is the inorganic EL element, AC drive is performed.

The inorganic EL element is an element of a known configuration made of known materials.

Examples of a structure (double insulation structure/three-layer structure) in which the inorganic light emitting layer is sandwiched between two insulation layers will now be explained.

The insulation layer preferably has the following properties.

High dielectric constant: to efficiently apply the electric field to the inorganic light emitting layer, and further, to increase the charge amount supplied to the light emitting layer to obtain high luminance.

High electrical insulation: to prevent breakage of the inorganic light emitting layer by a high electric field.

Few pin holes and defects: to prevent destruction of the inorganic light emitting layer.

High adhesion: to laminate to the inorganic light emitting layer and the electrode.

Non-propagation: to stop dielectric breakdown at one part and prevent a breakdown from spreading across the entire inorganic EL element.

Heat resistance: high temperature processing is necessary when preparing the inorganic EL element.

Transparency: the insulation layer on the light exiting surface 14b side must be more transparent than at least the inorganic light emitting layer.

The material used in the insulation layer of the known inorganic EL element is used for the material imparting the above properties to the insulation layer, and the amorphous material is generally used and nitride material such as $Si_3N_3$ etc., and oxide material such as $SiO_2$, $Ta_2O_5$, $Al_2O_3$, $Y_2O_3$, $Sm_2O_3$, $TiO_2$ etc. are selected.

The insulation layer may be a composite insulation layer in which a plurality of compounds such as SiON, SiAlON, TaSiO, ATO, $BaTa_2O_5$, $PbNb_2O_5$ and the like is mixed and used.

A different insulation material may be laminated to improve bonding with the electrode or to perform interface control between the inorganic light emitting layers.

The insulation layer inhibits the dielectric breakdown of the light emitting layer under high voltage and acts to form an insulation layer/inorganic light emitting layer interface serving as supply source for electrons, and thus thin-film forming methods in which only a few pin holes, cracks, and separation are created such as, a high frequency sputtering method, electron beam vapor deposition method, screen printing method and the like are preferably adopted.

The inorganic light emitting layer is mainly composed of an inorganic material, and any material may be used as long as light is emitted by the above mentioned light emitting mechanism, and the material used for the inorganic light emitting layer of the known inorganic EL element may be used.

Such material includes:

IIb-VIb group element-containing fluorescent material with ZnS as the host material; IIa-VIb group element-containing fluorescent with CaS and SrS serving as ionic crystal as the host material; thiogallate fluorescent material with thiogallate (gallium sulfide) such as $CaGa_2S_4$, $SrGa_2S_4$, $BaGa_2S_4$ and the like as the host material; sulfide luminescent material such as thioaluminate fluorescent material with compound (thioaluminate) of the aluminium sulfide as the host material;

metal oxide fluorescent material with metal oxide (binary compound) such as $Zn_2SiO_4$, $Ga_2O_3$, $Y_2O_3$, CaO, $GeO_2$, $SnO_2$ and the like as the host material and added with Mn and Cr or rare earth element as the light emitting center material; oxide luminescent material such as multiple oxide fluorescent material with metal oxide of ternary compound such as $ZnSiO_4$, $Zn_2GeO_4$, $ZnGa_2O_4$, $CaGa_2O_4$, $Y_4GeO_8$, $Y_2GeO_5$, $Y_2GeGe_2O_7$ and the like as the host material and added with Mn and Cr or rare earth element as the light emitting center material; and fluoride light emitting layer material such as Gd-added $ZnF_2$ with $CaF_2$ or $CdF_2$, $ZnF_2$ as the host material, and added with various transition metals or rare earth element as the light emitting center material.

The inorganic light emitting layer is formed on the insulation layer by physical vapor deposition method such as, a resistance heating vapor deposition method, an electron beam vapor deposition method, and a sputtering method; chemical vapor deposition method such as, a metal organic chemical vapor deposition method, a halogen transport low pressure CVD method, and an atomic layer epitaxy method; and known thin-film forming methods.

Heat treatment (annealing) such as, vacuum heat treatment and Rapid Thermal Annealing (RTA) method, electron beam annealing method, laser annealing method etc. are preferably performed after thin-film formation to obtain sufficient light emitting property.

In the inorganic EL cell, a manufacturing method for preparing the inorganic EL element precursor and laminating the same to the transparent conductor is more easily adopted than in the organic EL cell. This is because the anode side and the cathode side symmetrically have a pair of insulation layers and a pair of electrodes with the inorganic light emitting layer as the reference, and thus the inorganic EL element precursor of the same configuration can be adopted for both the first inorganic EL element and the second inorganic EL element.

Configuration other than the above may of course be used, and may be a five-layered structure in which a semi-insulation layer into which the insulation material such as $Ta_2O_5$ or $TiO_2$ is introduced is arranged between the insulation layer and the inorganic light emitting layer in the above mentioned double insulation structure to increase the amount of moving charge flowing through the light emitting layer and to enhance the dielectric breakdown property. The multilayered structure in which a layer is provided for each role (function) of the inorganic light emitting layer in the double insulation structure by continuously laminating a film of SrS:Ce and additive-free ZnS film over a few layers may be used.

Figure 9A:
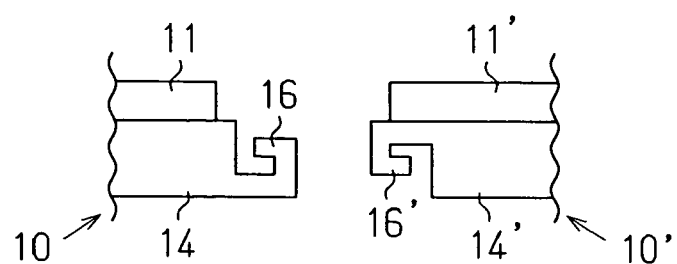
FIG. 9A is a schematic diagram of a connecting part for connecting a plurality of organic EL cells.
Figure 9B:
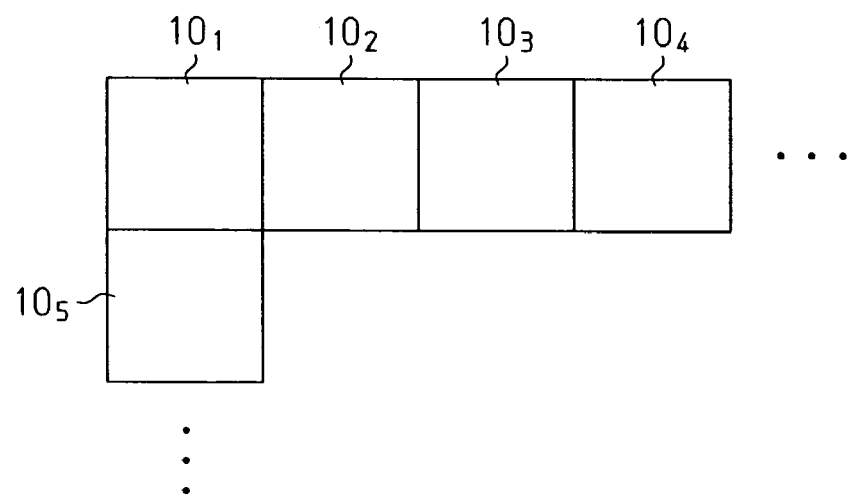
FIG. 9B is a schematic diagram of a plurality of organic EL cells connected to each other.

A coupling means for coupling with other EL cells is arranged at the organic EL cell, or the end of the substrate and the like, and thus allows each EL cell $10_1, 10_2, \ldots, 10_n$ (n is a natural number) to be coupled to each other, as shown in FIG. 9B. The organic EL light emitting device to be hereinafter described is thereby easily formed.

As shown in FIG. 9A, a key shaped coupling means 16 is arranged on one side of the substrate and on one side of another substrate 14', and by engaging the coupling means 16 of both substrates 14, 14' and relatively sliding the substrates 14 and 14' along the coupling means 16, the organic EL cell 10 and 10' are connected.

The coupling means is not limited to the means shown in FIG. 9. For instance, an adhesive member for adhering both EL cells when subjected to pressure may be applied to the edge of the substrate. A magnet may be attached to the edge of the substrate. A coupling means of a known member of a shape other than that shown in FIG. 9 may be used.

In this way, the organic EL light emitting device can be readily assembled by connecting the organic EL cells 10 with the coupling means. Further, the failed organic EL cell 10 may be removed from the organic EL light emitting device and easily replaced with a new EL cell 10.

In the organic EL cell 10, if the first electrode 122 and/or the second electrode 132 are transparent electrodes, the light exits from the first electrode 122 and/or the second electrode 132 side. In this case, the first electrode 122 and/or the second electrode 132 are formed using the materials used for the transparent conductor 11.

An organic EL cell according to a second embodiment of the present invention will now be explained.

Figure 10:
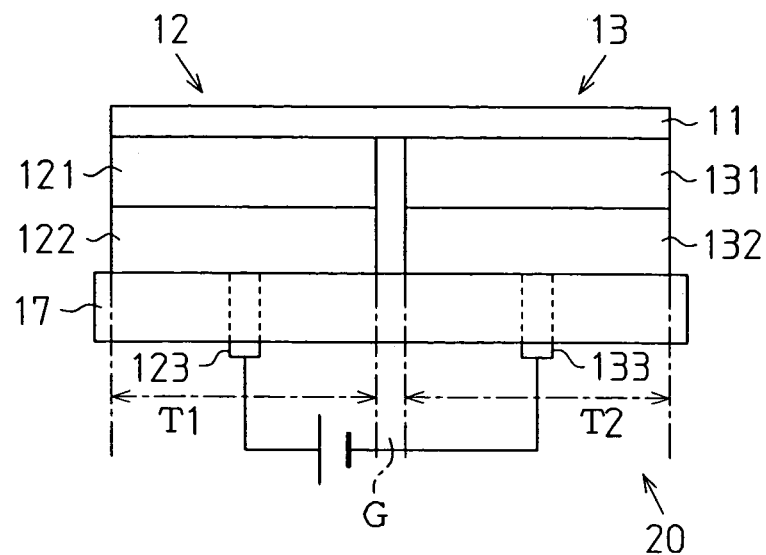
FIG. 10 is a cross sectional view of an organic EL cell according to a second embodiment of the present invention.

FIG. 10 is a schematic cross sectional view of the organic EL cell 20. In the organic EL cell 20, the first and second regions T1 and T2 are defined on the substrate 17. The first electrode 122 and the first organic layer 121 are laminated on the first region T1. The second electrode 132 and the second organic layer 131 are laminated on the second region T2.

The regions T1 and T2 are defined so as not to contact or overlap each other. Therefore, similar to the organic EL cell 10, the organic EL cell 20 includes a gap G between the first electrode 122 and the second electrode 132 and between the first organic layer 121 and the second organic layer 131. The transparent conductor 11 arranged on the first organic layer 121 and the second organic layer 131 electrically connects both layers 121 and 131.

The substrate similar to the transparent substrate 14 of the organic EL cell 10 is used as the substrate 17, but since the organic EL cell 20 is a top-emission type as apparent from the above mentioned configuration, a transparent substrate may not necessarily be used as the transparent 17. Therefore, the metal substrate or substrate formed with metal foil may also be used. Further, the substrate composed of a composite sheet in which a plurality of substrates of the same type or a different type is combined may be used.

When using the above configuration, a first wiring and a second wiring (not shown) are arranged between the substrate 17 and the first electrode 122 and between the substrate 17 and the second electrode 132, respectively, and power is supplied from such wiring.

The external power source is connected in the following way.

A first terminal 123 made of a conductive member is passed from the first electrode 122 through the substrate 17 to the side of the substrate 17 opposite the side including the first electrode 122.

A second terminal 133 made of a conductive member is passed from the second electrode 132 through the substrate 17 to the side of the substrate 17 opposite the side including the second electrode 132.

The first terminal 123 and the second terminal 133 are connected to the direct current power source, and when voltage is applied, the first organic layer 121 and the second organic layer 131 emit light, which exits outwards through the transparent conductor 11.

Operations and advantages similar to the organic EL cell are obtained with the organic EL cell 20 having the above configuration. Such an organic EL cell may be deformed similar to the organic EL cell, and the above mentioned operations and advantages can be further obtained by deformation.

Three examples for manufacturing the organic EL cell 20 will now be explained, but the present invention is not limited to such manufacturing examples, and may be manufactured combining the manufacturing examples of each of the above components. Similar to the manufacturing example of the above organic EL cell, the order of each step is not particularly limited unless otherwise stated, and each step may be achieved based on the film forming examples for each of the above components.

The first manufacturing example includes the following steps.

The first electrode 122 is formed on the region T1 of the substrate 17.

The first organic layer 121 containing the first organic luminescent material is formed on the surface of the first electrode 122 on the opposite side of the surface contacting the substrate 17.

The second electrode 132 is formed on the region T2 of the substrate 17.

The second organic layer 131 containing the second organic luminescent material is formed on the surface of the second electrode 132 on the opposite side of the surface contacting the substrate 17.

The transparent conductor 11 is formed on the surface of the first organic layer 121 and the second organic layer 131 on the opposite side of the surface contacting the respective electrodes 122 and 132 to electrically connect the first organic layer 121 and the second organic layer 131.

The gap G is formed so that the first organic layer 121 and the first electrode 122 are physically separated from the second organic layer 131 and the second electrode 132, respectively, by a predetermined distance.

Similar to the organic EL cell, the first organic luminescent material and the second organic luminescent material may be the same material.

The step for forming the gap G is as described above.

The organic EL cell may also be manufactured in the following way. The following preparing method is a method for preparing the organic EL device after arranging the insulation wall 15. The steps include:

forming the insulation wall 15, in which at least the surface is configured by the insulative member, on one surface of the substrate 17 for partitioning the relevant surface into two regions T1 and T2;

forming the first electrode 122 on the region T1;

forming the first organic layer 121 containing the first organic luminescent material on the surface of the first electrode 122 on the opposite side of the surface contacting the substrate 17;

forming the second electrode 132 on the second region T2;

forming the second organic layer 131 containing the second organic luminescent material on the surface of the second electrode 132 on the opposite side of the surface contacting the substrate 17; and forming the transparent conductor 11 on the surface of the first organic layer 121 and the second organic layer 131 on the opposite side of the surface contacting the respective electrodes 122 and 132 to electrically connect the first organic layer 121 and the second organic layer 131.

The organic EL cell 20 may also be manufactured in the following way.

The first organic electroluminescence element precursor including the first organic layer 121 containing the first organic luminescent material is formed between two conductors including the first electrode 122. At least one of the two conductors is transparent.

The second organic electroluminescence element precursor including the second organic layer 131 containing second organic luminescent material is formed between two conductors including the second electrode 132. At least one of the two conductors is transparent.

The first organic electroluminescence element precursor is bonded to the region T1 of the substrate 17 so as to connect the first electrode 122 with the substrate 17.

The second organic electroluminescence element precursor is bonded to the region T2 of the substrate 17 so as to connect the second electrode 132 with the substrate 17 and so as to be physically separated from the first organic electroluminescence element precursor.

The transparent conductor of the first organic electroluminescence element precursor and the transparent conductor of the second organic electroluminescence element precursor are connected by the transparent conductor 11.

The substrate 17 is laminated to the precursor after the organic electroluminescence element precursor is laminated to the transparent conductor 11.

An organic EL cell according to a third embodiment of the present invention will now be explained.

Figure 11:
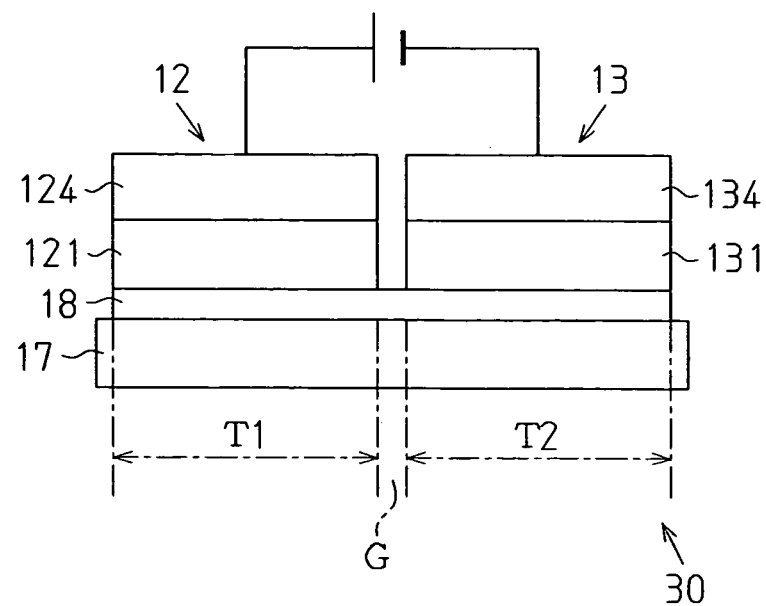
FIG. 11 is a cross sectional view of an organic EL cell according to a third embodiment of the present invention.

FIG. 11 is a schematic cross sectional view showing the configuration of the organic EL cell 30.

As shown in FIG. 11, the organic EL cell 30 has a conductor 18 formed on one surface of the substrate 17. The regions T1 and T2 are defined on the surface of the conductor 18 on the opposite side of the surface contacting the substrate 17. The regions T1 and T2 are defined with a predetermined distance in between so as not to contact or overlap each other. The first organic layer 121 is arranged on the region T1, and the first transparent electrode 124 configured by a transparent conductive body is arranged thereon. The second organic layer 131 is arranged on the region T2 and the second transparent electrode 134 configured by a transparent conductive body is arranged thereon.

The conductor 18 may not be transparent. Known electrode materials such as, the materials for forming the transparent conductor 11 or the materials for forming the first electrode 122 and the second electrode 132, are therefore arranged on the substrate 17 through the film forming method described above.

With regards to the first transparent electrode 124 and the second transparent electrode 134, one is the anode and the other is the cathode. Electrodes 124 and 134 are formed by simply forming the film by arranging the materials for forming the transparent electrode in the known organic EL device such as, materials for forming the transparent conductor 11 on the first organic layer 121 or the second organic layer 131 by the film forming method of the transparent conductor 11.

Other components are prepared in the same way as the components denoted with similar reference characters in the organic EL cell 10 or the organic EL cell 20.

In the organic EL cell 30 having the above configuration, the external power source is connected to the first transparent electrode 124 and the second transparent electrode 134, and when voltage is applied, the first organic layer 121 and the second organic layer 131 emit light similar to the organic EL cell 10 or the organic EL cell 20. The light emitted from the first organic layer 121 and the second organic layer 131 exits outwards from the EL cell 30 via the first transparent electrode 124 and the second transparent electrode 134, respectively. That is, the organic EL cell 30 is a top-emission type cell.

As apparent from the above explanation, advantages similar to the organic EL cell 10 and the organic EL cell 20 are obtained in the organic EL cell 30.

The organic cell 30 may be deformed in the same manner as the organic EL cell 10 and the organic EL cell 20, and similar operations and advantages are still obtained in the deformed configuration.

The organic EL cell 30 is manufactured similar to the above by combining the film forming method (preparing method) of each component. The organic EL cell 30 may be manufactured in the following way.

The conductor 18 is formed on one surface of the substrate 17.

The first organic layer 121 containing the first organic luminescent material is formed on the first region T1 on the surface of the conductor 18 on the opposite side of the surface contacting the substrate 17.

The first transparent electrode 124 is formed on the surface of the first organic layer 121 on the opposite side of the surface contacting the conductor 18.

The second organic layer 131 containing the second organic luminescent material is formed on the second region T2 on the surface of the conductor 18 on the opposite side of the surface contacting the substrate 17.

The second transparent electrode 134 is formed on the surface of the second organic layer 131 on the opposite side of the surface contacting the conductor 18.

The gap is formed so that the first organic layer 121 and the first transparent electrode 124 are each physically separated away from the second organic layer 131 and the second transparent electrode 134, respectively, by a predetermined distance.

The step of forming the gap is, as stated above, performed after forming the first organic EL element 12 and the second organic EL element 13, but the first organic EL element 12 and the second organic EL element 13 may be formed using the masking method so that both elements 12 and 13 do not contact each other.

The second manufacturing example is a manufacturing example for a configuration in which the insulation wall 15 configured by an insulative member is arranged in the gap G between the first organic EL device and the second organic EL element 13. More specifically, the second manufacturing example includes the following steps.

The conductor 18 is formed on one surface of the substrate 17.

The insulation wall 15 configured by the insulative member is formed on the surface of the conductor 18 on the opposite side of the surface contacting the substrate 17, to partition the first region T1 and the second region T2.

The first organic layer 121 containing the first organic luminescent material is formed on the first region T1 in the surface of the conductor 18 on the opposite side of the surface contacting the substrate 17.

The first transparent electrode 124 is formed on the surface of the first organic layer 121 on the opposite side of the surface contacting the conductor 18.

The second organic layer 131 containing the second organic luminescent material is formed on the second region T2 in the surface of the conductor 18 on the opposite side of the surface contacting the substrate 17.

The second transparent electrode 134 is formed on the surface of the second organic layer 131 on the opposite side of the surface contacting the conductor 18.

The step for arranging the insulation wall 15 may be performed after preparing the first organic EL elements 12 and 13, before preparing such elements, or after forming one of the elements.

The third manufacturing example is a method for manufacturing the organic EL cell 30 by preparing the first organic EL element precursor and the second organic EL element precursor and laminating such precursors on the conductor 18. More specifically, the method includes the steps of:

forming the conductor 18 on the substrate 17;

forming the first organic electroluminescence element precursor including the first organic layer 121 containing the first organic luminescent material between the first transparent electrode 124 and another conductor;

forming the second organic electroluminescence element precursor including the second organic layer 131 containing the second organic luminescent material between the second transparent electrode 134 and another conductor;

forming the first organic electroluminescence device by bonding the other conductor of the first organic electroluminescence element precursor to the first region T1 of the conductor 18; and forming the second electroluminescence element 13 physically separated away from the first organic electroluminescence element 12 by bonding the other conductor of the second electroluminescence element precursor to the second region T2 of the conductor 18 at a predetermined distance from the first region T1.

An organic EL cell 40 according to a fourth embodiment of the present invention will now be explained.

Figure 12:
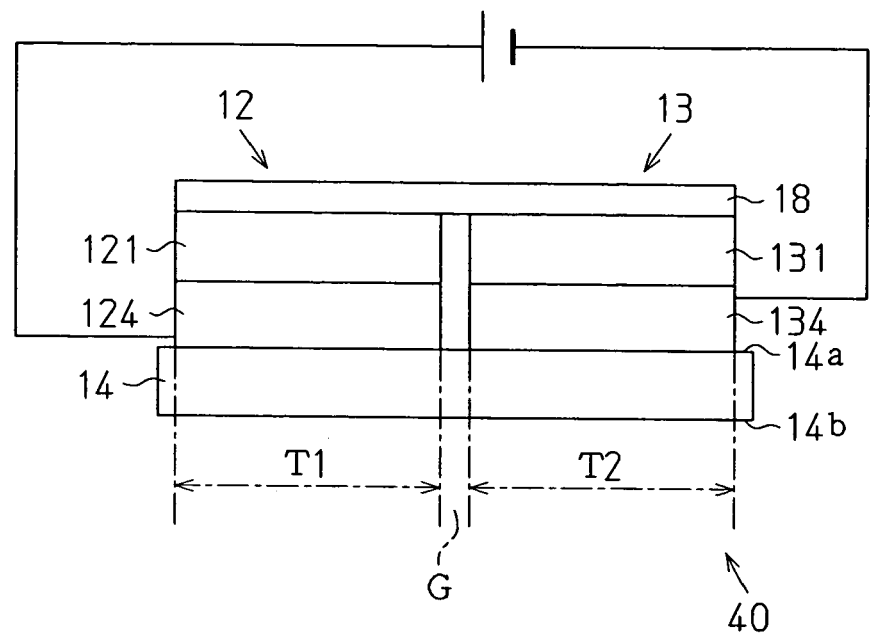
FIG. 12 is a cross sectional view of an organic EL cell according to a fourth embodiment of the present invention.

As shown in FIG. 12, the first region T1 and the second region T2 are defined on one surface of the transparent substrate 14 of the organic EL cell 40. The regions T1 and T2 are separated from each other by a predetermined distance and defined so as not to contact or overlap each other.

The first transparent electrode 124 and the first organic layer 121 are arranged in order on the first region T1 of the substrate 14. The second transparent electrode 134 and the second organic layer 131 are arranged in order on the second region T2 of the transparent substrate 14. The conductor 18 is arranged on the surface of the first organic layer 121 and the second organic layer 131 on the opposite side of the surface contacting the respective electrodes to electrically connect the organic layers.

In the organic EL cell 40 of the above configuration, the first transparent electrode 124 and the second transparent electrode 134 are connected to the external electrode, and when voltage is applied, the first organic layer 121 and the second organic layer 131 emit light. The light exits outwards from the EL cell 40 through the first transparent electrode 124 or the second transparent electrode 134 and the transparent substrate 14. Therefore, the organic EL cell 40 is a bottom-emission type.

In the organic EL cell 40, each component is prepared using the materials for forming the film similar to the above through the above film forming method. Thus, operations and advantages similar to the organic EL cells 10 to 30 are obtained. Further, the organic EL cell 40 may be deformed similar to the organic EL cells 10 to 30 and similar operations and advantages are still obtained from the deformed configuration.

In the organic EL cell 40, a first wiring configured by a transparent conductive body is arranged between the first transparent electrode 124 and the transparent substrate 14, and a second wiring configured by a transparent conductive body is arranged between the second transparent electrode 134 and the transparent substrate 14. By connecting the wirings to the external electrode, power is supplied to the first organic EL element 12 and the second organic EL element 13 without arranging regions other than the regions T1, T2 and the gap G on the transparent substrate 14, that is, by simply arranging the regions T1 and T2, and the gap G.

Arranging such wiring is effective particularly when aligning a plurality of organic EL cells 40. That is, by connecting the first wirings and the second wirings of the adjacent cell and connecting the ends of each wiring to the external electrode, the clearance created between the light emitting regions (regions T1 and T2) of each EL cell becomes extremely small.

A specific manufacturing example of the organic EL cell 40 will now be shown.

The first manufacturing example of the organic EL cell 40 includes the following steps.

The first transparent electrode 124 is formed on the first region T1 of one surface (light entering surface 14a) of the transparent substrate 14.

The first organic layer 121 containing the organic luminescent material is formed on the surface of the first transparent electrode 124 on the opposite side of the surface contacting the transparent substrate 14.

The second transparent electrode 134 is formed on the second region T2 on the relevant surface of the transparent substrate 14.

The second organic layer 131 containing the organic luminescent material is formed on the surface of the second transparent electrode 134 on the opposite side of the surface contacting the transparent substrate 14.

The conductor 18 is formed on the surface of the first organic layer 121 and the second organic layer 131 on the opposite side of the surface contacting the respective electrodes to electrically connect the first organic layer 121 and the second organic layer 131.

The gap G is formed so that the first organic layer 121 and the first transparent electrode 124 are physically separated from the second organic layer 131 and the second transparent electrode 134, respectively, by a predetermined distance.

The second manufacturing example of the organic EL cell 40 includes the following steps.

The insulation wall 15 configured by an insulative member is formed on one surface 14a of the transparent substrate 14 to partition the relevant surface into two regions T1 and T2.

The first transparent electrode 124 is formed on the region T1.

The first organic layer 121 containing the organic luminescent material is formed on the surface of the first transparent electrode 124 on the opposite side of the surface contacting the transparent substrate 14.

The second transparent electrode 134 is formed on the region T2.

The second organic layer 131 containing the organic luminescent material is formed on the surface of the second transparent electrode 134 on the opposite side of the surface contacting the transparent substrate 14.

The conductor 18 is formed on the surface of the first organic layer 121 and the second organic layer 131 on the opposite side of the surface contacting the respective electrodes to electrically connect the first organic layer 121 and the second organic layer 131.

The third manufacturing example of the organic EL cell 40 includes the following steps.

The first organic electroluminescence element precursor including the first organic layer 121 containing the organic luminescent material is formed between a conductor and another conductor, at least one of which being a transparent conductor (first transparent electrode) 124.

The second organic electroluminescence element precursor including the second organic layer 131 containing the organic luminescent material is formed between a conductor and another conductor, at least one of which being a transparent conductor (second transparent electrode) 134.

The first organic electroluminescence element precursor is bonded to the first region T1 of the transparent substrate 14 so that the transparent conductor (first transparent electrode) 124 is connected to the substrate 14.

The second organic electroluminescence element precursor is bonded to the second region T2 of the transparent substrate 14 so that the transparent conductor (second transparent electrode) 134 is connected to the substrate 14, and is physically separated from the first organic electroluminescence element precursor.

The other conductor of the first electroluminescence element precursor and the other conductor of the second electroluminescence element precursor are connected with the conductor 18.

The organic EL light emitting unit according to the present embodiment will now be explained.

The organic EL light emitting unit according to the present embodiment is configured by connecting a plurality of organic EL cells 10 to organic EL cells 40 of the same type or of a different type. More specifically, a plurality of the above mentioned organic EL cells is arranged, and the second electrode of each EL cell is electrically connected to the first electrode of at least one of the other EL cells. Further, the first organic electroluminescence element and the second organic electroluminescence element in each EL cell are arranged so as to be physically separated from the first organic electroluminescence element and the second organic electroluminescence element in another EL cell. The word "not connected" of course includes the meaning that conductors are not connected.

When voltage is applied between the first electrode not connected to the second electrode of another EL cell and the second electrode not connected to the first electrode of another EL cell, electrically present at the ends, the first layer and the second layer in each EL cell emit light.

An organic EL light emitting unit according to a fifth embodiment of the present invention will now be explained in detail with reference to FIG. 13.

Figure 13:
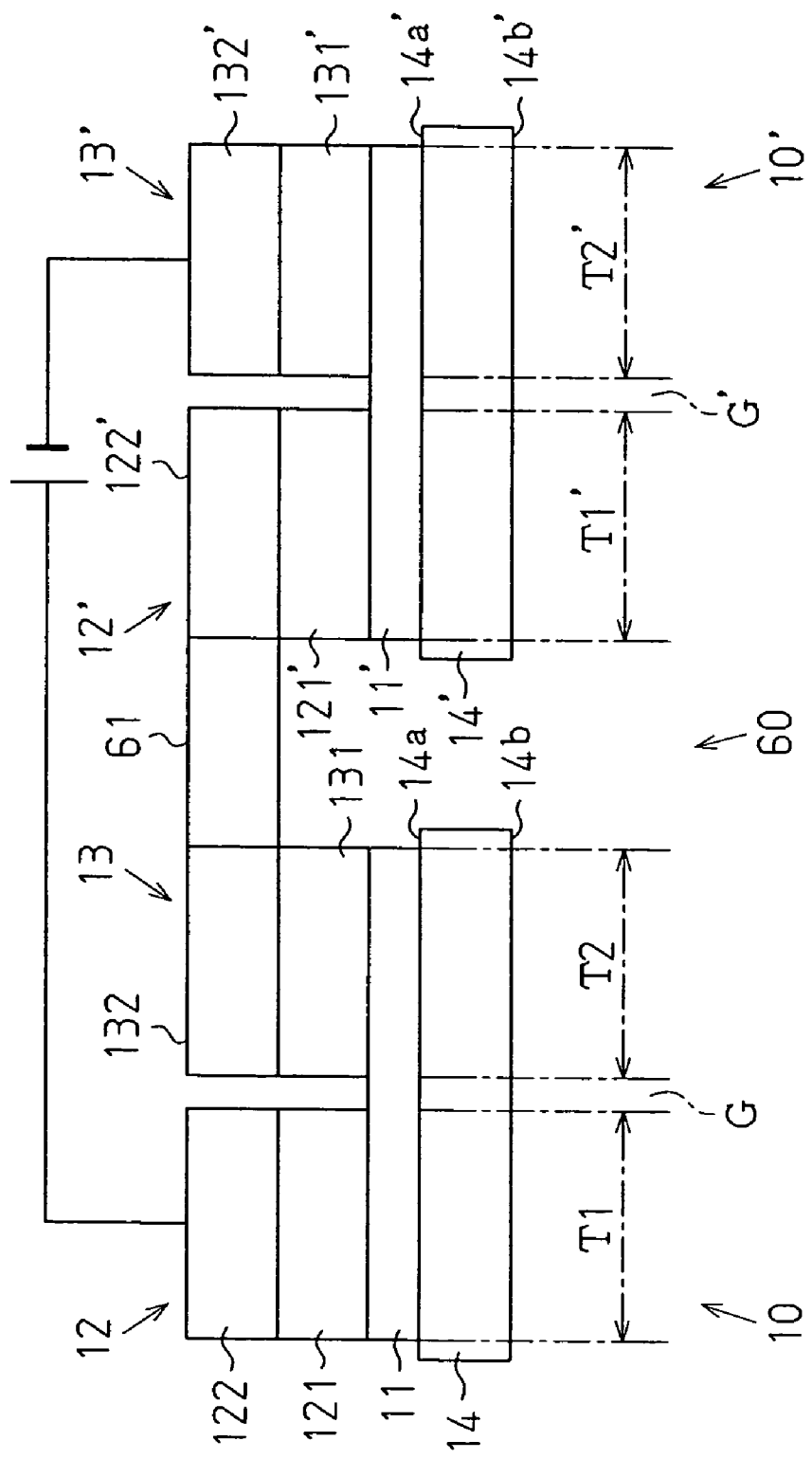
FIG. 13 is a cross sectional view of an organic EL cell according to a fifth embodiment of the present invention.

The organic EL light emitting unit 60 shown in FIG. 13 is configured by connecting two organic EL cells 10 and 10'. The configuration of the organic EL cells 10 and 10' is as described above.

The second electrode 132 of the organic EL cell 10 is connected with the first electrode 122' of the organic EL cell 10' by a connecting part 61 configured by a conductive body. The first electrode 122 of the organic EL cell 10 and the second electrode 132' of the organic EL cell 10' are connected to the external power source. That is, the first electrode 122 and the second electrode 132' are end electrodes not connected to the second electrode or the first electrode of the other EL cell, respectively.

The organic EL light emitting unit 60 has the above configuration, and thus when voltage is applied between the two end electrodes (first electrode 122 and second electrode 132'), the first organic layer 121, the second organic layer 131, the first organic layer 121' and the second organic layer 131' each emits light. The light exits outwards from the light emitting unit through the transparent conductor 11 or the transparent conductor 11', and the transparent substrate 14 or the transparent substrate 14'.

Therefore, operations and advantages similar to the organic EL cell are obtained in the organic EL light emitting unit 60, and in addition, the following advantages are obtained.

The area of the light emitting region of the unit, that is, the total area of all the regions T1 and T2 can be set freely.

As mentioned above, the organic EL element, in particular, is difficult to enlarge, but with the organic EL light emitting unit 60 of the above configuration, each organic EL element

12, 12', 13, 13' consequently becomes a unit with a large light emitting region even if the area of the respective light emitting region is small.

By adjusting the color of the light emitted from each organic EL element 12, 12', 13, 13', when expressing the color as an additive color, the adjustment thereof is more facilitated.

The number of organic layers is greater than the organic EL cell, and thus the adjustment of the color is easier than in the EL cell.

At the part where the organic EL cell is connected in series, the amount of current flowing through the organic EL element in each cell is the same.

Therefore, if each organic EL element has substantially the same configuration, and each of the constituting layer also has substantially the same structure, and further, if the area of each region T1 and T2 is generally the same, the amount and chroma of the light emitted from each organic EL element becomes substantially the same.

The connecting part 61 is prepared with the materials for forming the first electrode 122, the second electrode 132, the transparent conductor 11 and the like through the above mentioned method. The second electrode 132 and the first electrode 122' may be connected by wire bonding. The second electrode 132 and/or the first electrode 122' may of course be integrally formed.

The organic EL light emitting unit may be deformed in the following way.

Each organic EL cell may be deformed as described above.

In this case, each cell undergoes the same deformation or a different deformation.

Different types of EL cell may be bonded to prepare the light emitting unit as in bonding the organic EL cell 10 and the organic EL cell 20 to prepare the light emitting unit.

The substrates may be bonded together.

The substrates may be connected by a coupling means 16 and the like. The strength of the unit is thereby increased.

The light exiting direction of each organic EL cell may not be in substantially the same direction.

For example, in the configuration shown in FIG. 13, the direction normal to the light exiting surface 14b and the direction normal to the light exiting surface 14b' may not be the same direction. Further, a certain organic EL cell may be arranged on the back surface (side opposite the light exiting surface 14b) of the other organic EL cell to allow lighting from both sides. With such a configuration, light exits in a wider range than the organic EL cell.

The organic EL light emitting device according to the present invention will now be explained and a frame for the relevant device will also be explained.

The organic EL light emitting device according to the present embodiment is a light emitting device configured by connecting a plurality of organic EL cells and/or organic light emitting units according to the present embodiment. Lighting system and displays are examples of such light emitting device. The organic EL light emitting device according to the present embodiment will be explained by way of example of the lighting system. In the following explanation, the light emitting device configured only by the organic EL cell is provided, but it is apparent that the present invention is not limited thereto.

The lighting system according to the present embodiment is a lighting system arranged with a plurality of organic EL cells. For example, in the organic EL cell, light exits of substantially the same peak wavelength and/or substantially the same chroma, by aligning such in the direction normal to the light exiting surface, and providing an area light emitting lighting system of extremely large light emitting area. This is because the wiring of the organic EL cell and the external electrode is at the side opposite the light exiting surface, and the proportion of the non-light emitting region in the light exiting surface becomes extremely small.

By using the organic EL cell exiting the light of different peak wavelength and/or different chroma, and arranging each cell each at a predetermined position, symbols and figures may be expressed.

According to the above configuration, the lighting system using an EL having a large light emitting area is proposed.

When one part of an organic EL cell fails or if the useful life span ends, only the relevant cell needs to be replaced.

If one part of or all of the organic EL cells is connected in series, current of the same magnitude flows through each organic EL element in each cell connected in series. Therefore, if the area of the regions T1 and T2 of each cell at the region connected in series is substantially the same, and the element structure of each organic EL element and the structure of each layer are substantially the same, light of substantially the same luminance exits from each cell. Further, the life span of each cell is generally the same. Compared to the lighting system made of a single organic EL element having the same display region, defects such as uneven luminance is extremely reduced.

If a diffusion sheet is arranged more toward the light exiting side than the light exiting surface, the non-light emitting part (between the cells or region corresponding to the gap G) becomes less distinguishable.

The direction normal to the light exiting surface of each cell may not be substantially parallel. A plurality of directions is lighted in the lighting system configured in this way.

The frame for the organic EL light emitting device according to the present embodiment is a frame for fixing each organic EL cell at a predetermined position. The frame may be configured using a fixture for sandwiching and holding the substrate, a fixture connected to the above mentioned connecting part 16 and fixing the light emitting device, or a known fixture.

A monotone image display serving as a display device according to the present embodiment will now be explained.

In a monotone image display according to the present embodiment, one pixel is configured by one organic EL cell. The chroma of the light that each EL cell emits is set to be substantially the same. The image is displayed by controlling the light emission and non-light emission of each EL cell. Gradation control is performed by adjusting the luminance.

One pixel may be configured by a plurality of organic EL cells.

A known system such as, passive matrix system or an active matrix system is adopted as the driving system of the display. When the active matrix system is used, a conventional technique for providing a TFT for each pixel and driving may also be used, but each pixel may be driven by a normal switching element. That is, a monotone image display driven by a system simpler than the conventional art is provided.

A color display serving as another display device according to the present embodiment will now be explained.

In the color display according to the present embodiment, one sub-pixel constituting one pixel is configured by one organic EL cell. Each sub-pixel includes one EL cell emitting the light of a predetermined chroma such as, blue, red, or green. The color image is displayed by controlling light emission, non-light emission and amount of light emission of each EL cell.

In the same manner as described above, one sub-pixel may of course be configured by a plurality of organic EL cells.

A system similar to the monotone image display is used for the driving system.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A luminescence cell comprising:
    a conductor including one surface having a first region and a second region;
    a first layer laminated on the first region and containing a first luminescent material;
    a first electrode laminated on the first layer, the first region of the conductor, the first layer, and the first electrode forming a first electroluminescence element;
    a second layer laminated on the second region and containing a second luminescent material;
    a second electrode laminated on the second layer, the second region of the conductor, the second layer and the second electrode forming a second electroluminescence element, wherein the first layer and the second layer emit light rays when voltage is applied between the first electrode and the second electrode, and the first electrode and the first layer are physically separated from the second electrode and the second layer, respectively.

2. The luminescence cell according to claim 1, wherein the conductor is transparent, and the light rays emitted from the first layer and the second layer pass through the conductor to exit the luminescence cell.

3. The luminescence cell according to claim 2, wherein the conductor includes a rear surface opposite to the one surface, the luminescence cell further compnsing:
    a transparent substrate attached to the rear surface of the conductor.

4. The luminescence cell according to claim 2, wherein the first electrode and the second electrode each include a surface, respectively contacting the first layer and the second layer, and opposite surfaces, the luminescence cell further comprising:
    a substrate on the opposite surfaces of the first electrode and the second electrode.

5. The luminescent cell according to claim 4, wherein the substrate includes a surface contacting the first electrode and the second electrode and an opposite surface opposite to said surface, the luminescent cell further comprising:
    a plurality of terminals attached to the opposite surface of the substrate, the plurality of terminals including a first terminal and a second terminal extending through the substrate and electrically connected to the first electrode and the second electrode, respectively.

6. The luminescence cell according to claim 1, wherein the first electrode and the second electrode are transparent, and the light rays emitted from the first layer and the second layer pass through the first electrode and the second electrode to exit the luminescence cell.

7. The luminescent cell according to claim 6, wherein the conductor includes a rear surface opposite to the one surface, the luminescence cell further comprising:
    a substrate attached to the rear surface of the conductor.

8. The luminescence cell according to claim 6, wherein the first electrode and the second electrode each include a surface, respectively contacting the first layer and the second layer, and opposite surfaces, the luminescence cell further comprising:
    a transparent substrate attached to the opposite surfaces of the first electrode and the second electrode.

9. The luminescence cell according to claim 8, further comprising:
    a plurality of transparent wires arranged between the first electrode and the transparent substrate and between the second electrode and the transparent substrate, with the first and second electrodes connected to different ones of the wires.

10. The luminescence cell according to claim 1, wherein the one surface of the conductor has an area that is substantially the same as the total area of the first region and the second region.

11. The luminescence cell according to claim 1, wherein the one surface is substantially rectangular.

12. The luminescence cell according to claim 1, wherein the first layer and the second layer each include a plurality of layers that are laminated, with the structure of the plurality of layers from the side closer to the conductor in the first layer being substantially the same as the structure of the plurality of layers from the side closer to the second electrode in the second layer.

13. The luminescence cell according to claim 12, wherein the plurality of layers in the first layer are substantially the same as the corresponding plurality of layers in the second layer.

14. The luminescence cell according to claim 1, wherein the first layer emits light having a first peak wavelength, and the second layer emits light having a second peak wavelength that is substantially the same as the first peak wavelength.

15. The luminescence cell according to claim 1, wherein the first layer emits light having a first chroma, and the second layer emits light having a second chroma that is substantially the same as the first chroma.

16. The luminescence cell according to claim 1, wherein the first layer emits light having a first peak wavelength, and the second layer emits light having a second peak wavelength that differs from the first peak wavelength.

17. The luminescence cell according to claim 1, wherein the first layer emits light having a first chroma, and the second layer emits light having a second chroma that differs from the first chroma.

18. The luminescence cell according to claim 1, wherein the first region has an area that is substantially the same as the area of the second region.

19. The luminescence cell according to claim 1, wherein the first region and the second region are rectangular.

20. The luminescence cell according to claim 1, wherein the first region and the second region have the same shape and area.

21. The luminescence cell according to claim 1, further comprising:
    an insulation wall arranged between the first region and the second region on the one surface of the conductor.

22. The luminescence cell according to claim 21, wherein the insulation wall is transparent.

23. The luminescence cell according to claim 21 or 22, wherein the insulation wall has a light diffusion function.

24. The luminescence cell according to claim 1, further comprising:
    a protective member for preventing entry of moisture and oxygen into at least one of the first layer and the second layer.

25. The luminescence cell according to claim 1, wherein the first electrode and the second electrode each have a portion exposed to the exterior of the luminescence cell, and the first electrode and the second electrode each have a protection function for preventing entry of moisture and oxygen from the portion exposed to the exterior to the first layer and the second layer.

26. The luminescence cell according to claim 1, wherein the first luminescent material is an organic luminescent material.

27. The luminescence cell according to claim 1, wherein the first luminescent material is an inorganic luminescent material.

28. The luminescence cell according to claim 1, wherein the second luminescent material is an organic luminescent material.

29. The luminescence cell according to claim 1, wherein the second luminescent material is an inorganic luminescent material.

30. The luminescence cell according to claim 1, further comprising:
   a light exiting surface from which light exits the luminescence cell;
   a rear surface opposite to the light exiting surface; and
   a light diffusion member arranged at a position that is closer to at least one of the light exiting surface and the rear surface than the first layer and the second layer.

31. The luminescence cell according to claim 1, further comprising:
   a connecting means for physically connecting the luminescence cell to another luminescence cell.

32. A luminescence device including more than one luminescence cell according to claim 31, wherein the more than one luminescence cell are connected to one another by the connecting means.

33. A luminescence unit including more than one luminescence cell according to claim 1, wherein:
   the second electrode of each cell is electrically connected to the first electrode of at least one other cell; and
   the first electroluminescence element and the second electroluminescence element of each cell are physically separated from the first electroluminescence element and the second electroluminescence element of another cell;
   wherein the more than one luminescence cell includes:
   a first end electrode disconnected from the second electrode of other cells and located at an electrical end;
   a second end electrode disconnected from the first electrode of other cells and located at an electrical end;
   wherein the first and second layers emit light in each cell when voltage is applied between the first end electrode and the second end electrode.

34. A luminescence device comprising:
   more than one luminescence unit according to claim 33;
   the first electroluminescence element and the second electroluminescence element of each luminescence unit are physically separated from the first electroluminescence element and the second electroluminescence element of another luminescence unit;
   wherein the more than one luminescence unit includes:
   a first end electrode disconnected from the second electrode of other luminescence units and located at an electrical end;
   a second end electrode disconnected from the first electrode of other luminescence units and located at an electrical end;
   wherein the first and second layers emit light in each cell of each luminescence unit when voltage is applied between the first end electrode and the second end electrode.

35. The luminescence device according to claim 34, wherein the luminescence device is held in a frame including a luminescence unit support for holding each luminescence cell at a predetermined position.

36. A luminescence device including more than one luminescence cell according to claim 1, wherein:
   the more than one luminescence cell are electrically connected to each other and
   the first electroluminescence element and the second electroluminescence element of each luminescence cell is physically separated from the first electroluminescence element and the second electroluminescence element of another cell.

37. The luminescence device according to claim 36, wherein the one surface of the conductor in each luminescent cell faces toward substantially the same direction.

38. The luminescence device according to claim 36, wherein the more than one luminescence cell are arranged along a plane.

39. The luminescence device according to claim 36, wherein the more than one luminescence cell are series-connected.

40. The luminescence device according to claim 36, wherein at least one of the more than one luminescence cell configures a single pixel.

41. The luminescence device according to claim 36, wherein at least one of the more than one luminescence cell configures a single sub-pixel, a plurality of which configures a single pixel.

42. The luminescence device according to claim 36, wherein the luminescence device is held in a frame including a luminescence cell support for holding each luminescence cell at a predetermined position.

* * * * *

UNITED STATES PATENT AND TRADEMARK OFFICE
CERTIFICATE OF CORRECTION

PATENT NO. : 7,397,178 B2
APPLICATION NO. : 10/996838
DATED : July 8, 2008
INVENTOR(S) : Hironori Ito et al.

It is certified that error appears in the above-identified patent and that said Letters Patent is hereby corrected as shown below:

Column 4, line 56, please delete "forming second" and insert therefore -- forming a second --;

Column 6, lines 37, 43, 53, 61, 63 and 65, please delete "cross sectional" and insert therefore -- cross-sectional --;

Column 7, line 1, please delete "cross sectional" and insert therefore -- cross-sectional --;

Column 7, line 39, please delete "sublayers, electron" and insert therefore -- sublayers, and electron --;

Column 8, line 6, please delete "cross sectional" and insert therefore -- cross-sectional --;

Column 8, line 33, please delete "is substantially square plate" and insert therefore -- is a substantially square plate --;

Column 10, line 34, please delete "exits" and insert therefore -- exiting --;

Column 12, line 31, please delete "sodium-potassium alloys, sodium-potassium alloys," and insert therefore -- sodium-potassium alloys, --;

Column 12, line 51, please delete "of a multiple layers" and insert therefore -- of multiple layers--;

Column 13, line 10, please delete "is-lowered" and insert therefore -- is lowered --;

Column 14, line 9, please delete "constitution." and insert therefore -- constitution: --;

Column 14, line 30, please delete "Each of functions" and insert therefore -- Each of the functions --;

Column 14, line 35, please delete "injection-characteristic;" and insert therefore -- injection characteristic; --;

UNITED STATES PATENT AND TRADEMARK OFFICE
CERTIFICATE OF CORRECTION

PATENT NO. : 7,397,178 B2
APPLICATION NO. : 10/996838
DATED : July 8, 2008
INVENTOR(S) : Hironori Ito et al.

It is certified that error appears in the above-identified patent and that said Letters Patent is hereby corrected as shown below:

Column 15, line 11, please delete "substantially same peak" and insert therefore -- substantially the same peak --;

Column 15, line 61, please delete "properties." and insert therefore -- properties: --;

Column 16, line 62, please delete "low." and insert therefore -- low; --;

Column 15, line 64, please delete "extended." and insert therefore -- extended; --;

Column 15, line 67, please delete "improved." and insert therefore -- improved; and --;

Column 17, line 2, please delete "-tetraphienyl-" and insert therefore -- -tetraphenyl- --;

Column 17, line 38, please delete "to rise an" and insert therefore -- to rise to an --;

Column 17, line 41, please delete "functions." and insert therefore -- functions: --;

Column 17, line 43, please delete "anode." and insert therefore -- anode; --;

Column 17, line 45, please delete "cathode." and insert therefore -- cathode; --;

Column 17, line 47, please delete "field." and insert therefore -- field; --;

Column 17, line 49, please delete "(exciton)." and insert therefore -- (exciton); and --;

Column 27, line 49, please delete "(c)." and insert therefore -- (c): --;

Column 28, line 8, please delete "byf" and insert therefore -- by --;

Column 31, line 47, please delete "below." and insert therefore -- below: --;

Column 31, line 49, please delete "number." and insert therefore -- number; and --;

Column 32, line 43, please delete "property as" and insert therefore -- property of --;

Column 32, line 45, please delete "articles." and insert therefore -- articles: --;

UNITED STATES PATENT AND TRADEMARK OFFICE
CERTIFICATE OF CORRECTION

PATENT NO. : 7,397,178 B2
APPLICATION NO. : 10/996838
DATED : July 8, 2008
INVENTOR(S) : Hironori Ito et al.

It is certified that error appears in the above-identified patent and that said Letters Patent is hereby corrected as shown below:

Column 32, line 47, please delete "20001)." and insert therefore -- 20001); --;

Column 32, line 50, please delete "938." and insert therefore -- 938; and --;

Column 34, line 41, please delete "modification and" and insert therefore -- modifications and --;

Column 34, line 61, please delete "is remained" and insert therefore -- is retained --;

Column 36, line 19, please delete "cross sectional" and insert therefore -- cross-sectional --;

Column 36, line 30, please delete "19 to protect" and insert therefore -- 19 may also protect --;

Column 36, line 32, please delete "change may also be included." and insert therefore -- change. --;

Column 38, line 13, please delete "properties." and insert therefore -- properties: --;

Column 38, line 18, please delete "luminance." and insert therefore -- luminance; --;

Column 38, line 20, please delete "field." and insert therefore -- field; --;

Column 38, line 22, please delete "layer." and insert therefore -- layer; --;

Column 38, line 24, please delete "electrode." and insert therefore -- electrode; --;

Column 38, line 27, please delete "element." and insert therefore -- element; --;

Column 38, line 29, please delete "element." and insert therefore -- element; and --;

Column 39, line 43, please delete "introduced is arranged" and insert therefore -- introduced, is arranged --;

Column 39, line 58, please delete "key shaped" and insert therefore -- key-shaped --;

Column 40, line 5, please delete "Further, the" and insert therefore -- Further, a --;

UNITED STATES PATENT AND TRADEMARK OFFICE
CERTIFICATE OF CORRECTION

PATENT NO. : 7,397,178 B2
APPLICATION NO. : 10/996838
DATED : July 8, 2008
INVENTOR(S) : Hironori Ito et al.

It is certified that error appears in the above-identified patent and that said Letters Patent is hereby corrected as shown below:

Column 40, line 16, please delete "cross sectional" and insert therefore -- cross-sectional --;

Column 40, line 34, please delete "transparent 17" and insert therefore -- substrate 17 --;

Column 41, line 64, please delete "containing second" and insert therefore -- containing the second --;

Column 42, line 18, please delete "cross sectional" and insert therefore -- cross-sectional --;

Column 47, line 14, please delete "constituting layer" and insert therefore -- constituting layers --;

Column 48, line 5, please delete "cell exiting light" and insert therefore -- cell with light exiting --.

Signed and Sealed this

First Day of September, 2009

David J. Kappos
*Director of the United States Patent and Trademark Office*